(12) United States Patent
Kierse

(10) Patent No.: US 8,890,301 B2
(45) Date of Patent: Nov. 18, 2014

(54) PACKAGING AND METHODS FOR PACKAGING

(75) Inventor: Oliver J. Kierse, Killaloe (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 13/564,674

(22) Filed: Aug. 1, 2012

(65) Prior Publication Data

US 2014/0035113 A1 Feb. 6, 2014

(51) Int. Cl.
*H01L 23/48* (2006.01)

(52) U.S. Cl.
USPC .......................................... 257/690; 257/693

(58) Field of Classification Search
USPC .................. 257/678, 690, 692, 693, 700, 701
See application file for complete search history.

(56) References Cited

U.S. PATENT DOCUMENTS

| | | | |
|---|---|---|---|
| 5,444,293 A | 8/1995 | Li | |
| 5,531,860 A | 7/1996 | Li | |
| 5,847,458 A * | 12/1998 | Nakamura et al. | 257/738 |
| 6,410,363 B1 | 6/2002 | Tani et al. | |
| 6,501,161 B1 | 12/2002 | Lee | |
| 6,608,366 B1 | 8/2003 | Fogelson et al. | |
| 6,872,599 B1 | 3/2005 | Li et al. | |
| 7,023,074 B2 | 4/2006 | Li et al. | |
| 7,183,630 B1 | 2/2007 | Fogelson et al. | |
| 7,410,834 B2 | 8/2008 | Fukaya et al. | |
| 7,443,043 B2 * | 10/2008 | Sakamoto | 257/787 |
| 7,541,667 B2 * | 6/2009 | Miyaki et al. | 257/676 |
| 7,842,889 B2 * | 11/2010 | Hata et al. | 174/538 |
| 8,089,141 B1 * | 1/2012 | Smith | 257/676 |
| 8,334,584 B2 * | 12/2012 | Camacho et al. | 257/676 |
| 8,502,358 B2 * | 8/2013 | Camacho et al. | 257/666 |
| 2005/0029640 A1 * | 2/2005 | Amano et al. | 257/678 |
| 2012/0306065 A1 | 12/2012 | Bin Mohd Arshad | |

* cited by examiner

*Primary Examiner* — S. V. Clark
(74) *Attorney, Agent, or Firm* — Knobbe, Martens, Olson & Bear LLP

(57) ABSTRACT

A packaged integrated device can include a die attach pad having a top surface and a bottom surface. A plurality of leads physically and electrically separated from the die attach pad can be positioned at least partially around the perimeter of the die attach pad. An integrated device die can be mounted on the top surface of the die attach pad. A package body can cover the integrated device die and at least part of the plurality of leads, and at least a portion of the bottom surface of each of the plurality of leads can be exposed through the package body. A plating layer can cover substantially the entire width of an etched lower portion of the outer end of each lead and at least the exposed portion of the bottom surface of each lead.

23 Claims, 24 Drawing Sheets

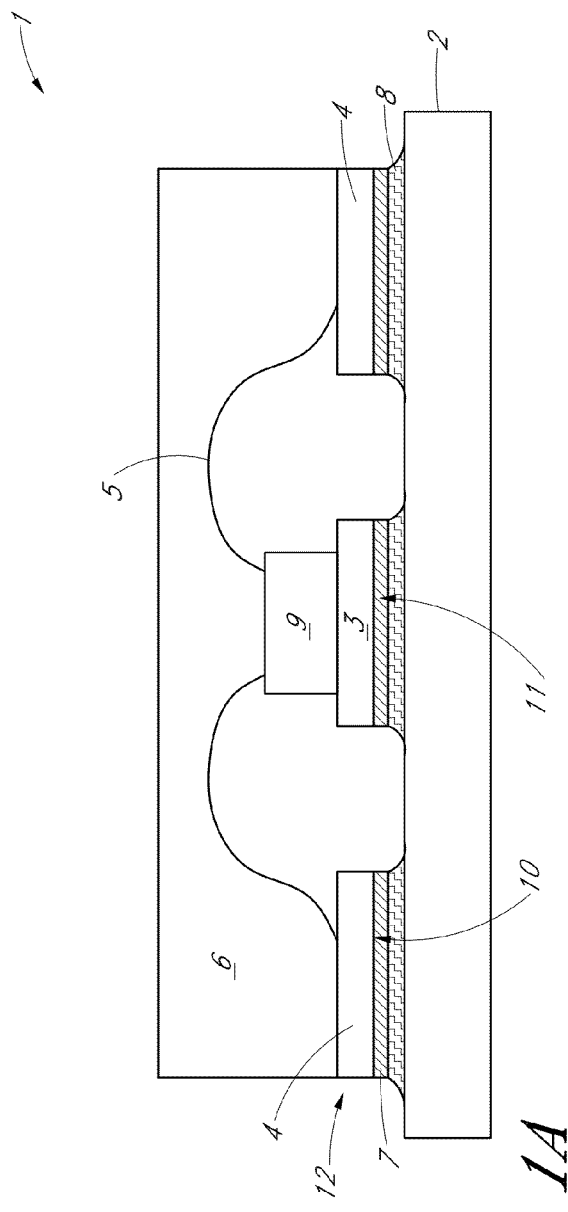
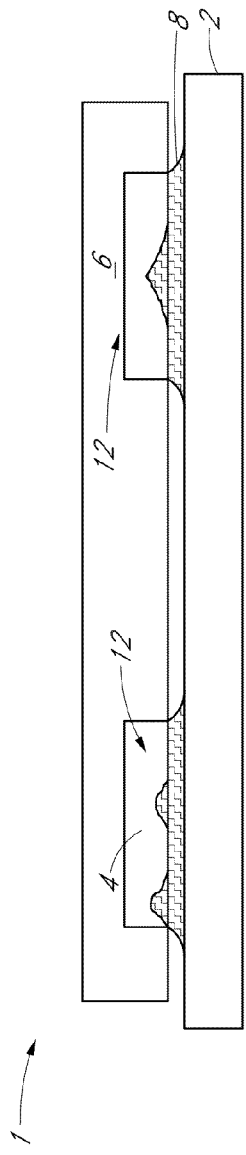
FIG. 1A
FIG. 1B

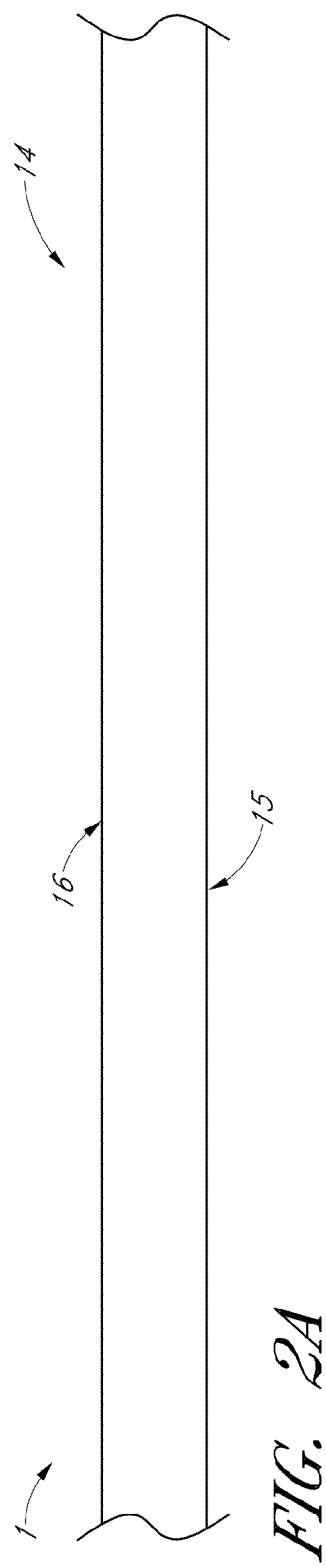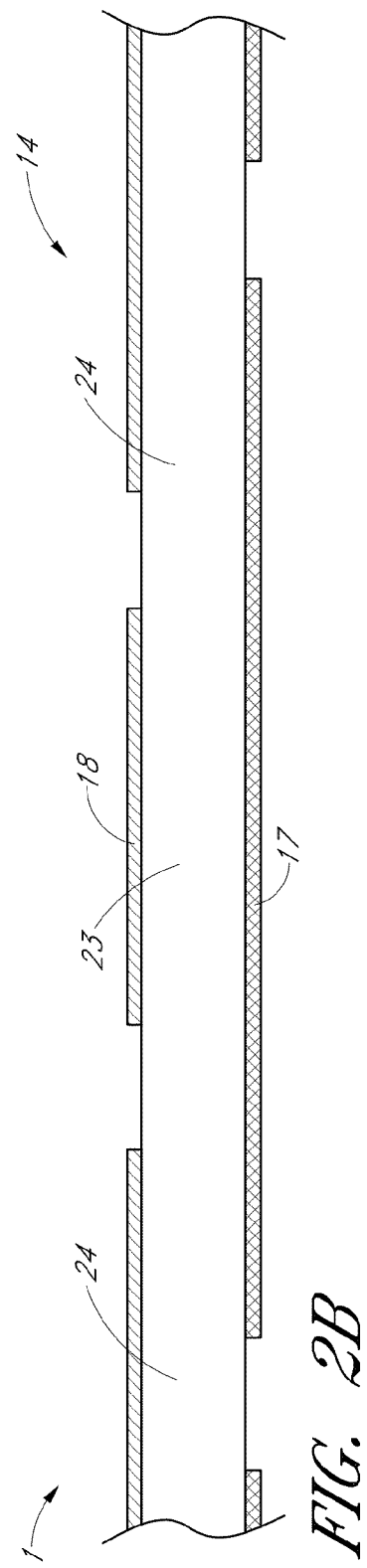

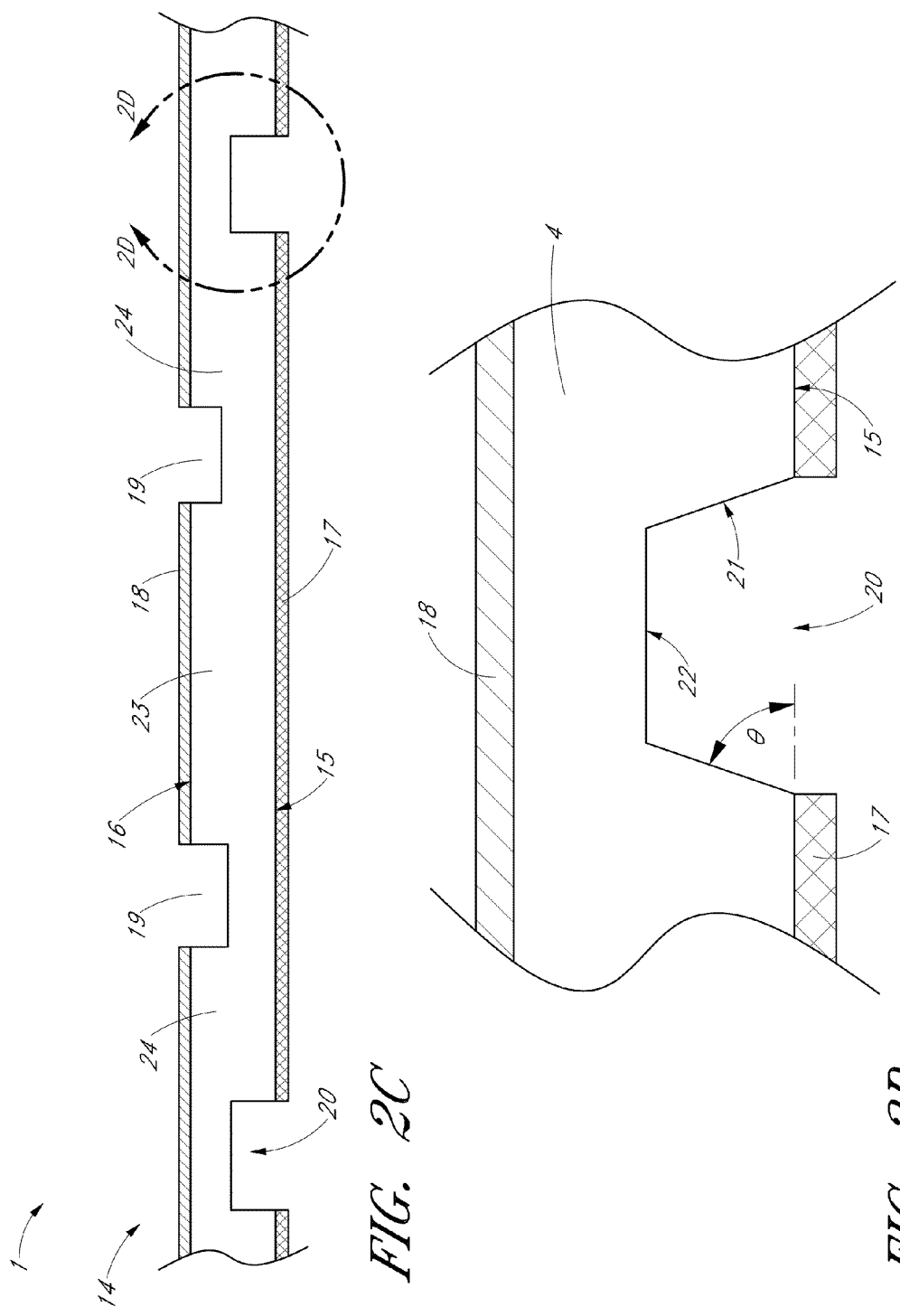

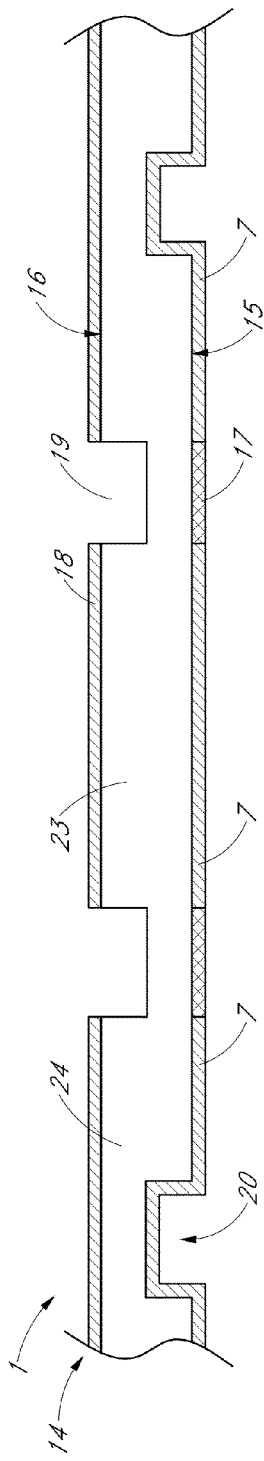
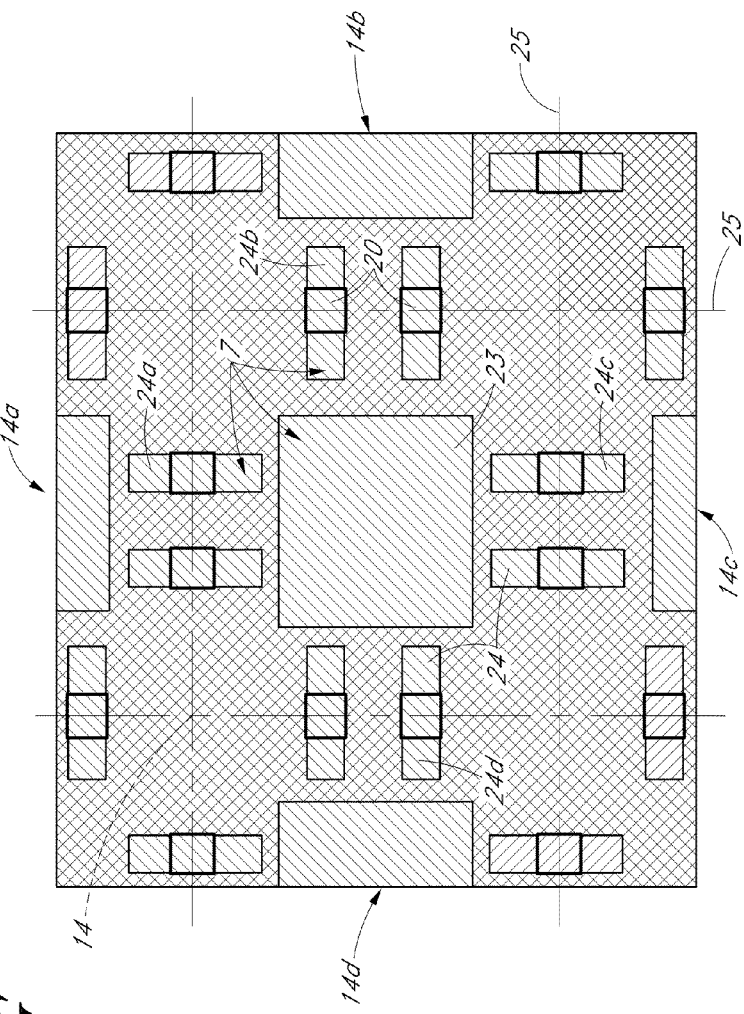
FIG. 2G
FIG. 2H

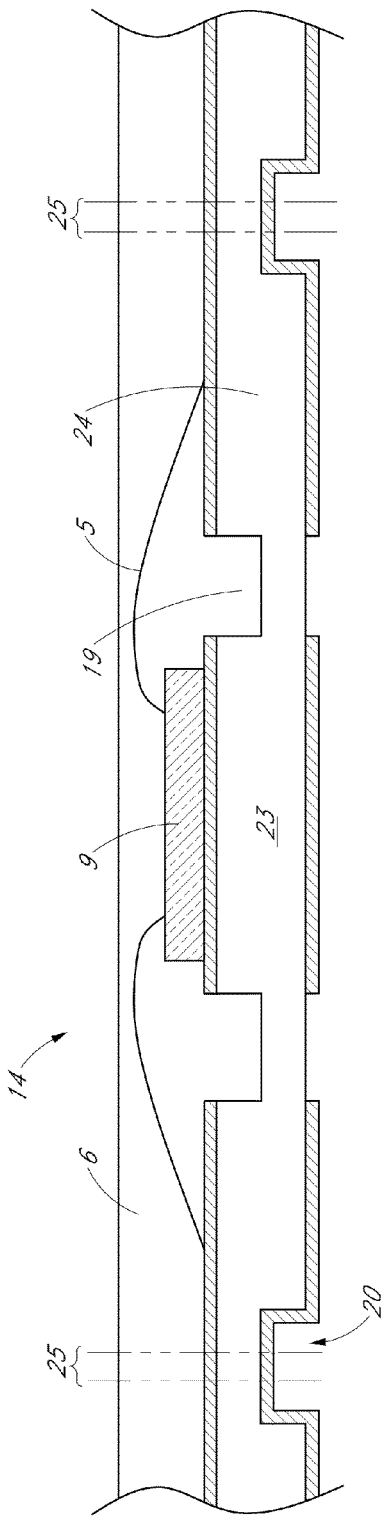
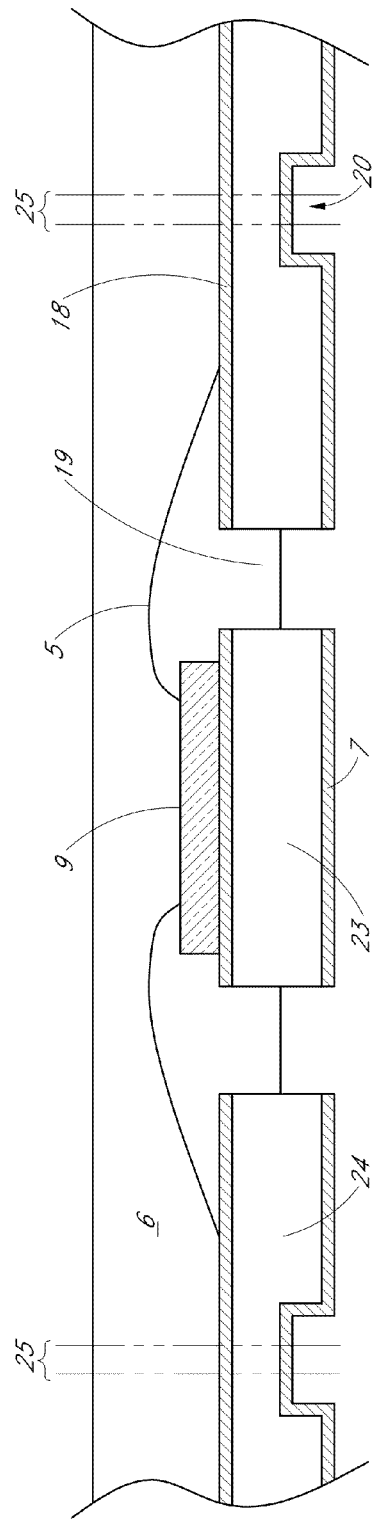
FIG. 2I
FIG. 2J

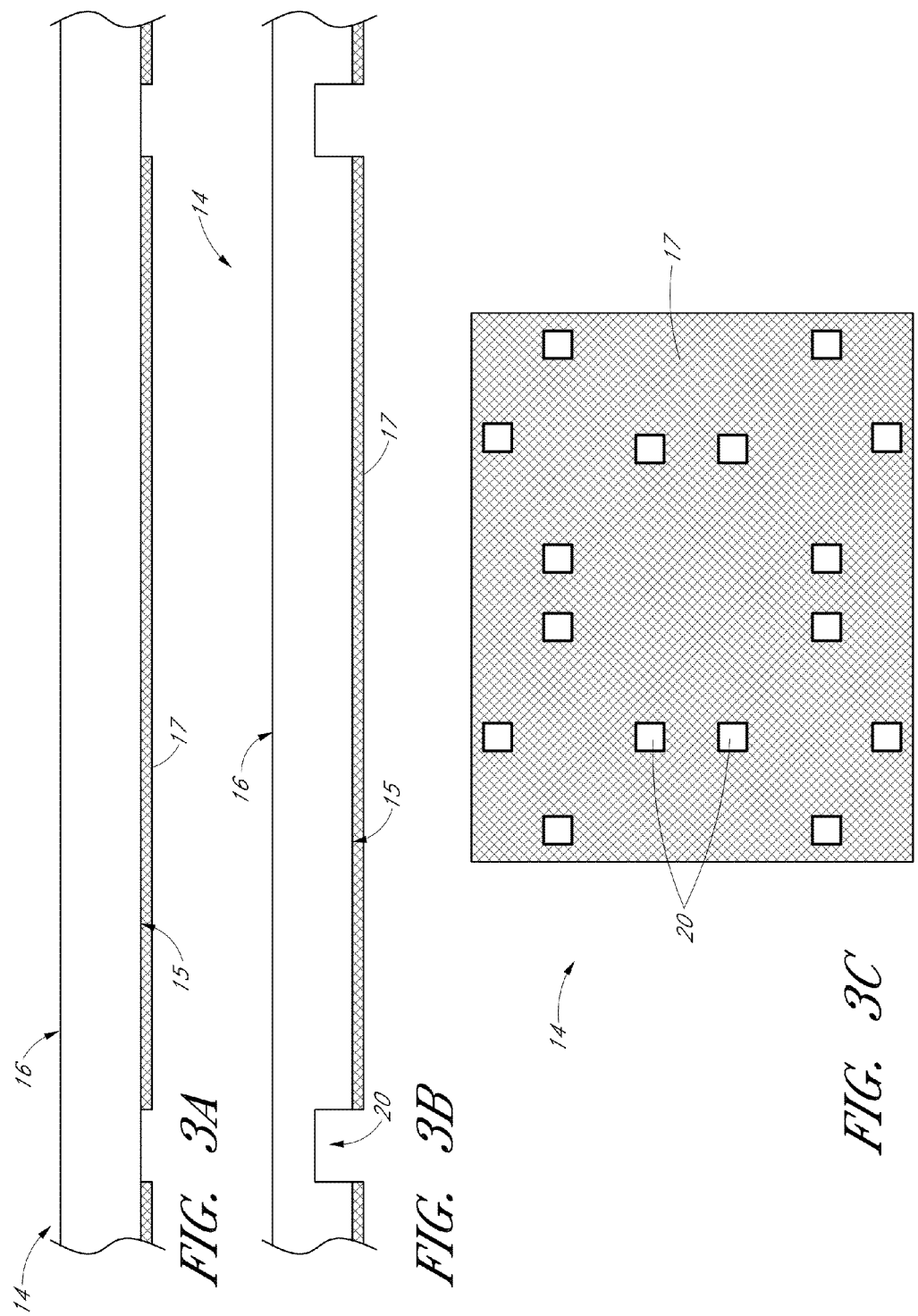

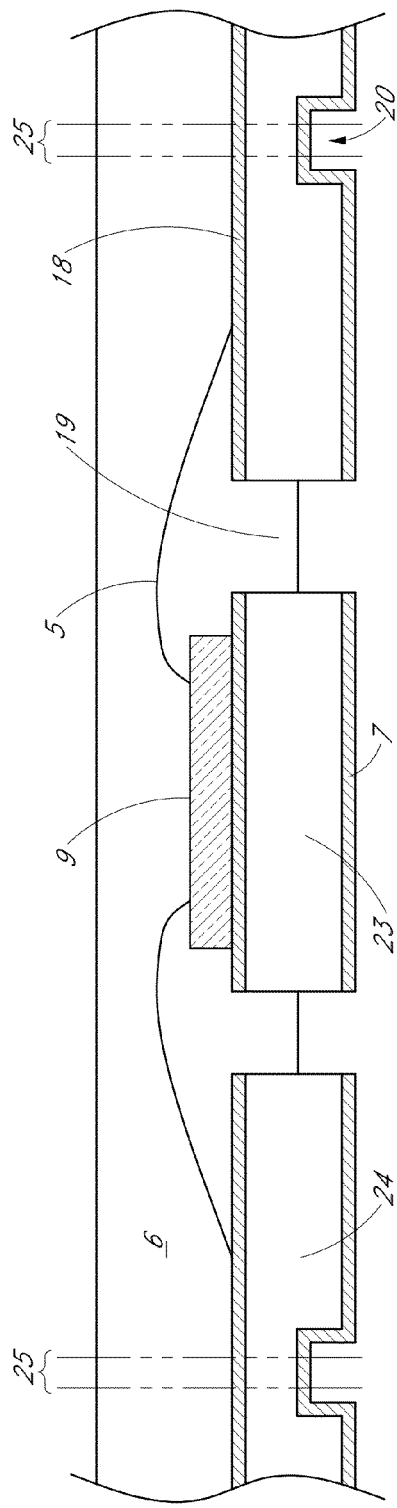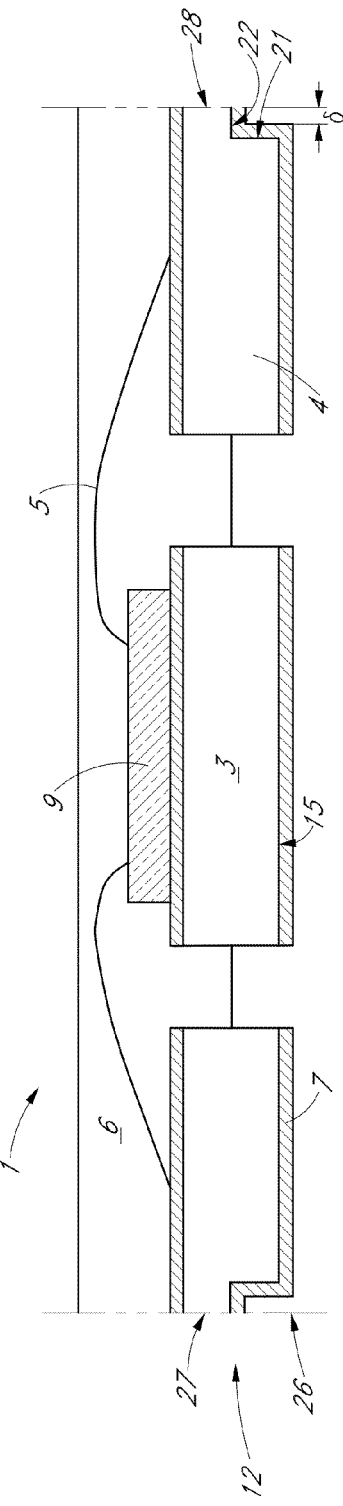

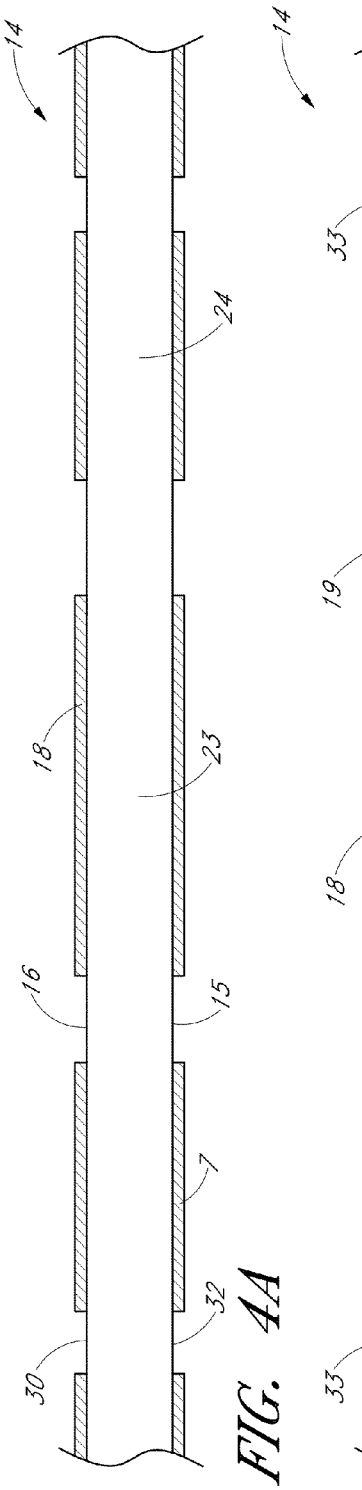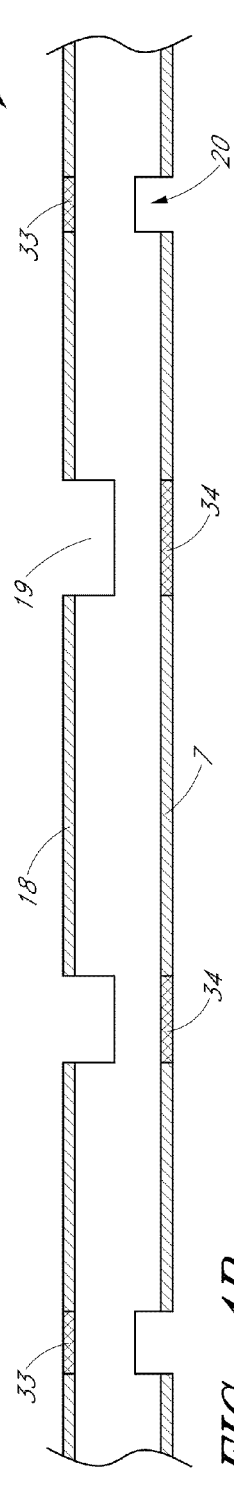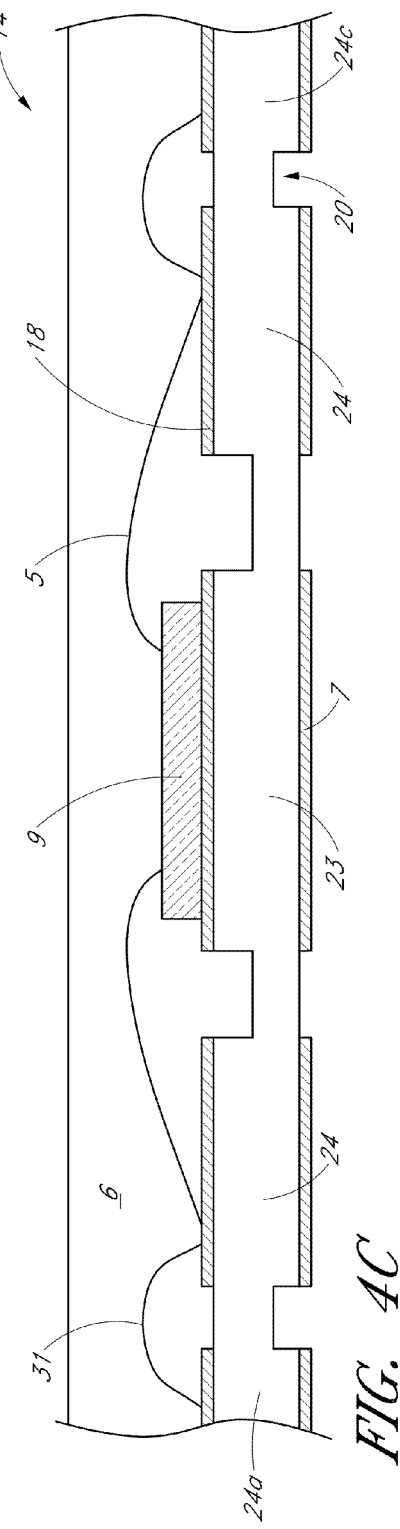

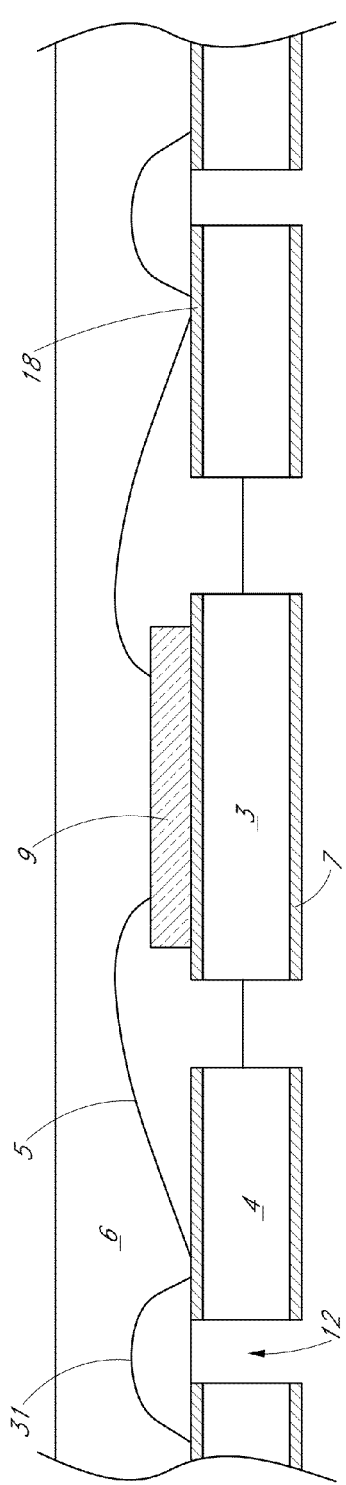
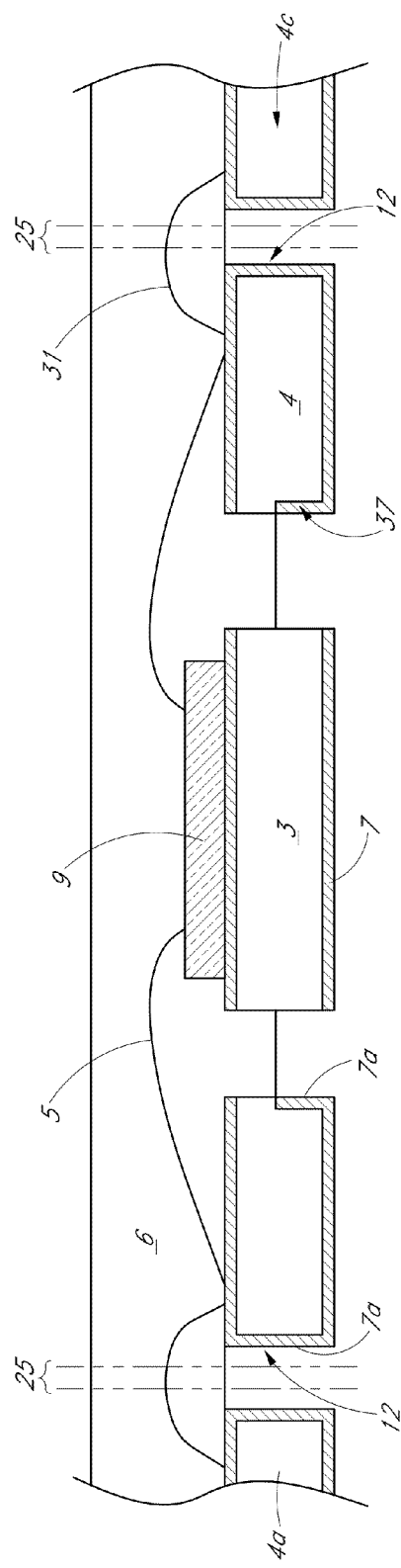
FIG. 4D
FIG. 4E

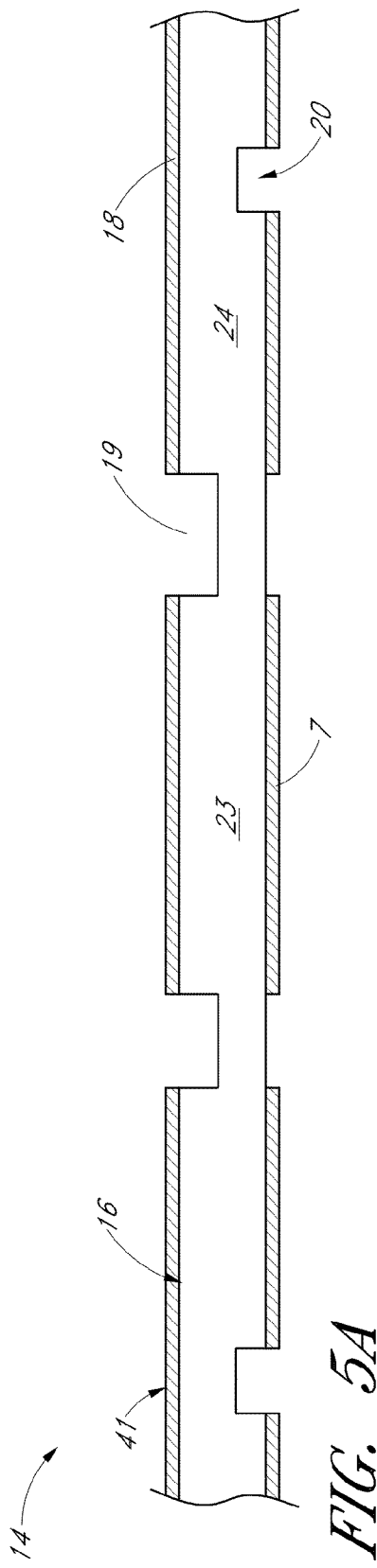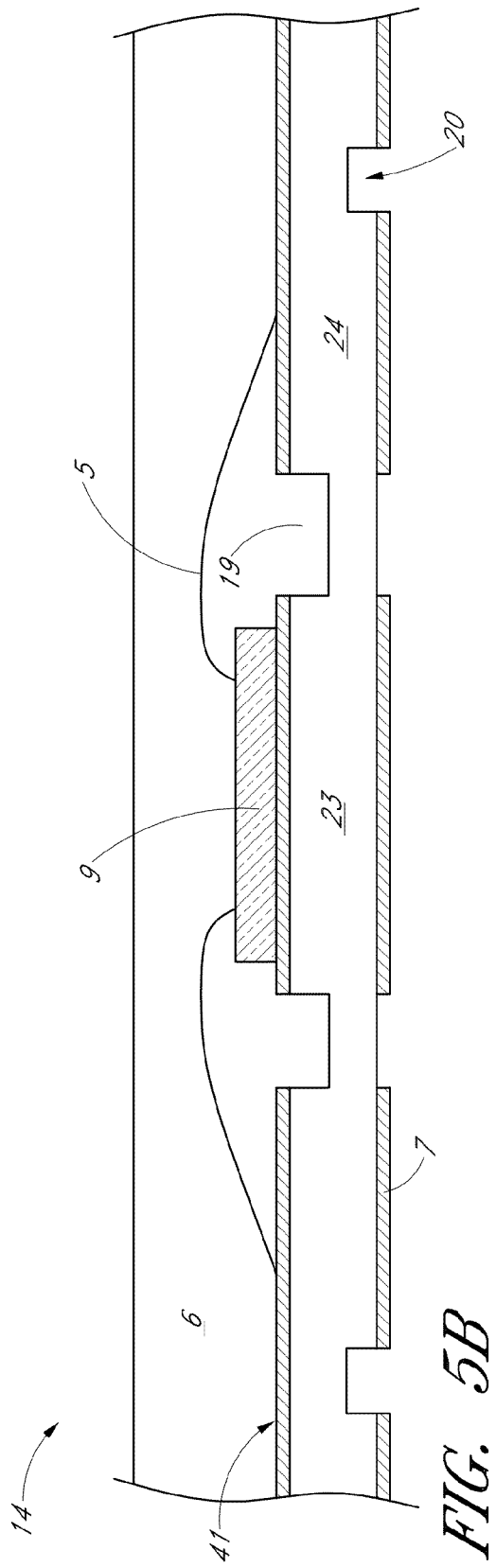

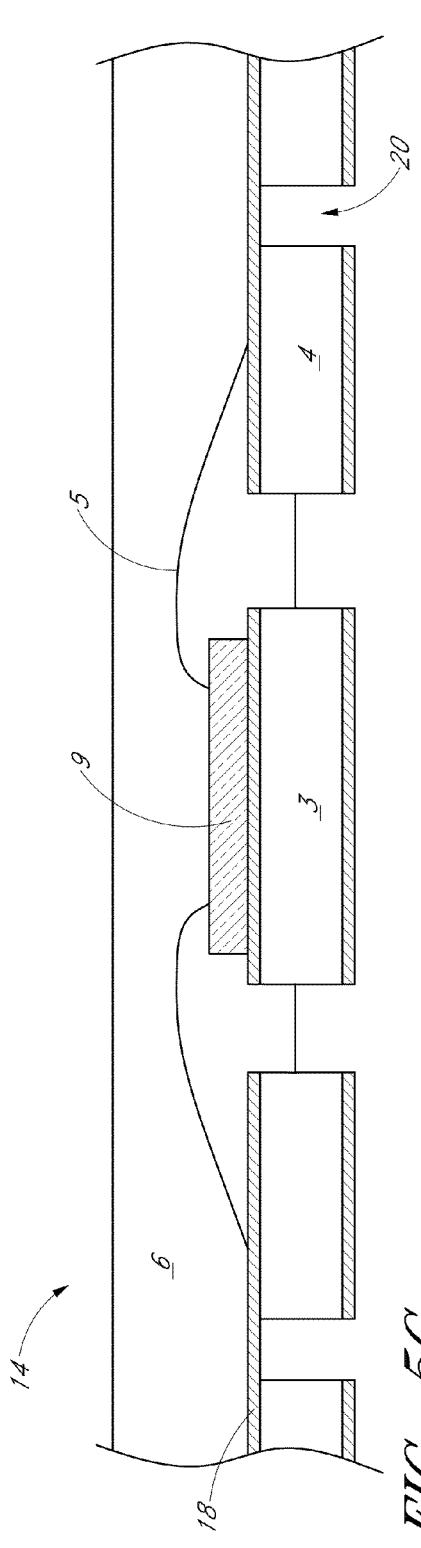
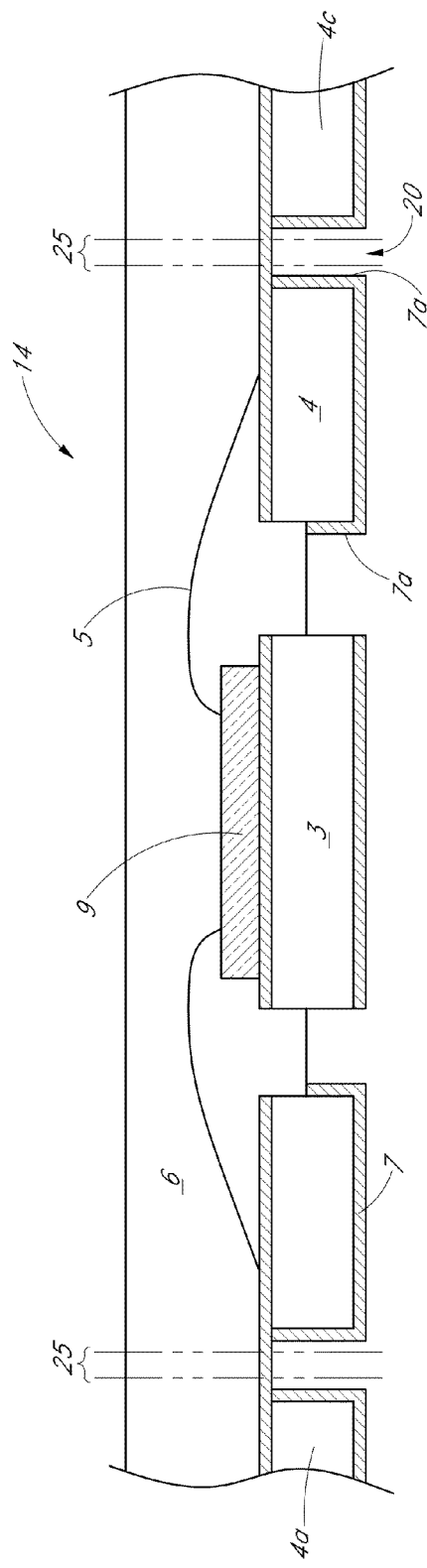
FIG. 5C
FIG. 5D

PACKAGING AND METHODS FOR PACKAGING

BACKGROUND OF THE INVENTION

1. Field of the Invention

The field relates generally to integrated devices and methods for packaging the same. In particular, the field relates to devices and methods for improving electrical connections between integrated device packages and external devices.

2. Description of the Related Art

Integrated electronic and electromechanical devices ("integrated devices") are used in a wide variety of products, including computers, mobile devices, automobiles, consumer electronics devices, medical devices, and many other applications. Integrated circuit dies and microelectromechanical systems (MEMS) dies are two examples of integrated device dies that can be used within a larger electrical/electronic, mechanical, or other type of system. For example, an integrated circuit die (e.g., a chip) can be used as a processor within a larger system, e.g., a mobile smartphone, tablet computer, or an automobile. In order to operate within the larger system, the integrated device die is typically packaged and configured to couple to the larger system. Often, integrated device packages (also referred to herein as "packages") are configured to couple to a system substrate, e.g., a motherboard made of printed circuit board (PCB) material, that is in turn electrically and mechanically coupled to the larger system.

There are a variety of types of integrated device packages. For example, Quad Flat No-Lead (QFN) packages have gained popularity in recent years. A QFN package can be a leadframe based, encapsulated chip scale package that can generally comprise a square or rectangular package body with leads on four sides of the body. The package leads are exposed on the bottom surface of the package body to couple to the system substrate, e.g., a PCB substrate coupled to and situated within a larger system like an automobile or a computer. However, the packages are dubbed "no-lead" because the leads are flush with or embedded within the side surfaces of the package such that they do not protrude laterally. Other types of integrated device packages are also suitable for various applications, including ball grid array (BGA) packages, Quad Flat Packages (QFP), thin small-outline packages (TSOP), dual flat no-lead (DFN) packages, and many other types of packages.

As mentioned above, the integrated device package can be coupled to a larger system by electrically and mechanically coupling the package to a system substrate. One way to couple an integrated device package to a system substrate is using solder. In soldering techniques, exposed leads of the integrated device package can be bonded to corresponding electrical contact pads on the system substrate. For coupling surface mount components, e.g., integrated device packages, to a system substrate (e.g., a PCB substrate), reflow soldering can be used. In reflow soldering techniques, a solder paste or ball is applied to electrical contact pads on the system substrate (and/or also on the leads of the integrated device package). After contacting the leads of the integrated device package to the electrical contact pads of the system substrate, a hot reflow process is applied, during which the solder can wet various portions of the leads of the integrated device package, including exposed bottom surfaces and portions of end surfaces of the leads.

When integrated device packages are soldered to system substrates, it is important to ensure that the electrical and mechanical connection is reliable and strong. Indeed, one failure mode for electronic/electrical or electromechanical systems is the failure of solder joints connecting integrated device packages to system substrates. For example, external loads can damage the solder joint and can cause the leads of the package and the contact pads of the system substrate to mechanically decouple from one another. It can therefore be important to inspect solder joints after mounting components to the system substrate.

Alternatively, visible inspection systems, such as an automated optical inspection (AOI) system, can be employed to visually inspect the solder joints. Because surface mounted components may obscure the view of solder joints underlying the components (e.g., solder that is applied to bottom surfaces of the leads in an integrated device package), one way to estimate the reliability of a solder joint is to inspect the solder that reflows up the outer ends of the leads. For example, in some arrangements, if the solder suitably couples to certain portions of the outer ends of the leads to form a strong and reliable bond, then the user can, in some circumstances, infer that the solder bonding the bottom surface of the leads to the contact pads of the system substrate is also strong and reliable. In addition, the application of solder to the outer ends of the leads may also improve the overall solder strength because solder can be applied on a different plane, e.g., the side of the leads. Accordingly, it can be desirable to improve the adherence of solder to outer end portions of the leads in an integrated device package.

SUMMARY

In one embodiment, a packaged integrated device is disclosed. The packaged integrated device can comprise a die attach pad having a top surface and a bottom surface. The packaged integrated device can further comprise a plurality of leads physically and electrically separated from the die attach pad and positioned at least partially around the perimeter of the die attach pad, each lead having a top surface, a bottom surface, and an outer end facing away from the die attach pad. In addition, an integrated device die can be mounted on the top surface of the die attach pad. A package body can cover part or all of the integrated device die and at least part of the plurality of leads, wherein at least a portion of the bottom surface of each of the plurality of leads is exposed through the package body. The packaged integrated device can further include a plating layer covering substantially the entire width of an etched lower portion of the outer end of each lead and at least the exposed portion of the bottom surface of each lead.

In another embodiment, a leadframe having a top surface and a bottom surface is disclosed. The leadframe can comprise an array of multiple leadframe device cells, each leadframe device cell comprising a die attach pad region surrounded by a trench formed through the top surface of the leadframe, wherein the trench extends partially through the thickness of the leadframe. Each leadframe device cell can further include a plurality of lead regions formed across the trench from the die attach pad region and positioned around at least a portion of the perimeter of the die attach pad region, wherein the trench extends between adjacent lead regions, and wherein each lead region has a width. The leadframe device cell can also comprise a plurality of recessed regions etched in the bottom surface of the leadframe and defining the boundary between adjoining lead regions in neighboring leadframe device cells, wherein the recessed regions extend substantially across the width of each lead region.

In yet another embodiment, a method for forming a leadframe for an integrated device package is disclosed. The method can comprise providing a leadframe having a top surface and a bottom surface. In addition, lead regions and die attach pad regions can be formed in the leadframe to define multiple leadframe device cells. Recessed regions can be etched in the bottom surface of the leadframe at boundaries between adjoining lead regions in neighboring leadframe device cells, wherein the recessed regions cover substantially the entire width of the lead regions. A plating layer can be applied to internal surfaces of the recessed regions and the bottom surface of the leadframe covering the lead regions and the die attach pad regions

BRIEF DESCRIPTION OF THE DRAWINGS

FIG. 1A illustrates a side cross-section of an integrated device package mounted on a system substrate.

FIG. 1B is a schematic end elevational view of the package shown in FIG. 1A.

FIGS. 2A-2D illustrate side cross-sections of a partially fabricated leadframe device cell at various stages of fabrication.

FIG. 2G is a side cross-sectional view of a partially fabricated leadframe device cell at a stage of fabrication.

FIG. 2H is a bottom plan view of the leadframe device cell of FIG. 2G.

FIG. 2I is a side cross-sectional view of the leadframe device cell after assembly.

FIG. 2J is a side cross-sectional view of the leadframe device cell after removing portions of the leadframe that underlie the trench.

FIGS. 3A and 3B are side cross-sectional views of a leadframe device cell in various stages of fabrication according to another embodiment.

FIG. 3C is a bottom plan view of the device cell of FIG. 3B.

FIGS. 3F-3I are side cross-sectional views of the leadframe device cell in various stages of fabrication according to one embodiment.

FIGS. 4A-4E are side cross-sectional views of a leadframe device cell in various stages of fabrication according to another embodiment.

FIGS. 5A-5D are side cross-sectional views of a leadframe device cell in various stages of fabrication according to another embodiment.

DETAILED DESCRIPTION

Figure 1C:
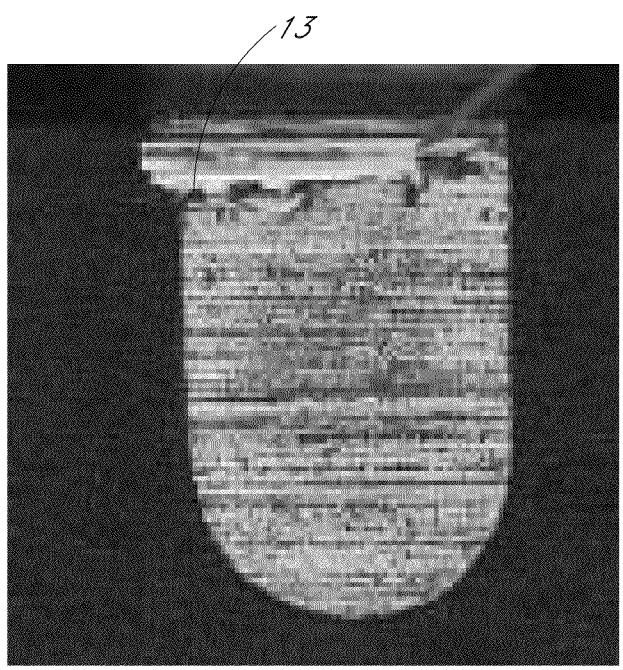
FIG. 1C is a micrograph illustrating one example of a sawed surface.

As described above, it can be important to reliably and accurately inspect solder joints after mounting to the system substrate. One method of inspecting the solder joint reliability is by using x-ray imaging. In x-ray imaging, a user can see through the surface mounted components to analyze the solder joint formed between the bottom surface of exposed lead portions and the contact pads of the system substrate. For many situations, however, x-ray imaging techniques may be too expensive, complex, time consuming, and/or they may not detect hidden problems or defects with the solder joint.

FIG. 1A is a side cross-sectional view of an integrated device package 1 (a "package") mounted on a system substrate 2. FIG. 1B is a schematic end view of the package 1 shown in FIG. 1A. The package 1 can include a die attach pad 3 and multiple leads 4 positioned around at least part of the perimeter of the die attach pad 3. The leads 4 can be physically and electrically separated from the die attach pad 3. As will be discussed in more detail below, the die attach pad 3 and the leads 4 can be formed from a leadframe in some embodiments. The leadframe (and hence the die attach pad 3 and leads 4) can be formed of an electrically conductive material, such as copper (Cu). An integrated device die 9 can be mounted on the die attach pad 3. In some implementations, the integrated device die 9 can be mounted to the die attach pad 3 using a conductive adhesive. In other implementations, the integrated device die 9 can be soldered to the die attach pad 3. The solder can thereby provide a mechanical connection between the integrated device die 9 and the die attach pad 3. In other embodiments, the integrated device die 9 can be mounted on the die attach pad 3 using any other suitable technique. In some embodiments, it can be desirable to electrically ground the die attach pad 3.

The integrated device die 9 can be electrically coupled to one or more of the leads 4. In FIG. 1A, for example, a wire bond 5 can electrically couple the integrated device die 9 to the leads 4. The wire bond 5 can be formed of any suitable conductor, including, e.g., gold (Au). The integrated device die 9 can be any suitable device die. For example, the integrated device die 9 can be an integrated circuit die, such as an Application-Specific Integrated Circuit, a microelectromechanical systems (MEMS) die, an optoelectronics device die, or any other suitable device die. The package 1 can be enclosed by a package body 6. The package body 6 can be a molding material that defines the package outline and that may encapsulate the integrated device die 9 and at least part of the plurality of leads 4, as illustrated in FIG. 1A. In some embodiments, e.g., embodiments that employ multiple dies, one or more dies may be fully encapsulated, while the remaining die(s) may be at least partially exposed (e.g., in light sensor dies). Skilled artisans will appreciate that other ways to encapsulate or enclose a die are possible. In other implementations, the package body 6 can include a package lid enclosing the integrated device die and coupling to a substrate. All or a portion of a bottom surface 10 of the leads 4 can be exposed through the package body 6. The molding compound can be applied across an array of lead frame cells, and body 6 and leads 4 can be simultaneously singulated by punching or sawing.

As shown in FIGS. 1A and 1B, the bottom surfaces 10 of the leads 4 and a bottom surface 11 of the die attach pad 3 can be plated with a conductive bottomside plating layer 7 to improve the solderability of the leads 4 and the die attach pad 3 to corresponding contact pads on the system substrate 2. During solder reflow, solder 8 can cover the exposed bottom surface 10 of the leads 4 and can in some instances flow up at least part of outer ends 12 of the leads 4, as shown in FIG. 1B. Without appropriate plating and/or lead design, the portions of solder that flow up the outer ends 12 of the leads 4 can be uneven and unreliable, as illustrated by the uneven solder bonded to the outer ends 12 in FIG. 1B. This uneven coating may be caused by various factors. For example, the underlying base metal may oxidise and prevent or slow solder wetting to the lead. After reflow, solder joints 8 can be formed to electrically and mechanically couple the leads 4 and the die attach pad 3 to the contact pads on the system substrate 2.

As described above, it can be desirable to form a strong and reliable solder bond 8 on the outer ends 12 of the leads 4. Inspecting solder bonded to the outer ends 12 can assist in determining whether the solder joints connecting the bottom surfaces 10 of the leads 4 to the contact pads on the system substrate 2 are reliable. However, without at least some end wall plating, any solder that bonds to the outer ends 12 of the leads 4 would not be representative of the solder bond on the hidden plated underside of the leads 4. For instance, in some manufacturing processes, each package 1 can be formed from one device cell within a larger leadframe array. The package 1 can be physically and electrically separated from the other device cells within the array (e.g., singulated) by sawing through the leads 4 and the package body 6 to form the individual, singulated package 1. One problem with saw singulation, however, is that the plating process is typically performed for the whole leadframe array before singulation, such that no plating is provided for the lead ends, which are not exposed until after singulation.

Moreover, the sawing process can cause burrs on the sawed surface, which in the case of a singulated package includes sawed outer ends 12 of the leads 4. FIG. 1C is a micrograph illustrating one example of a sawed metal surface, much like that of an outer end portion of a lead that has been saw singulated. As illustrated in FIG. 1C, the sawing process can create one or more burrs 13 that are formed as a result of the saw's interaction with the metal surface.

Figure 1D:
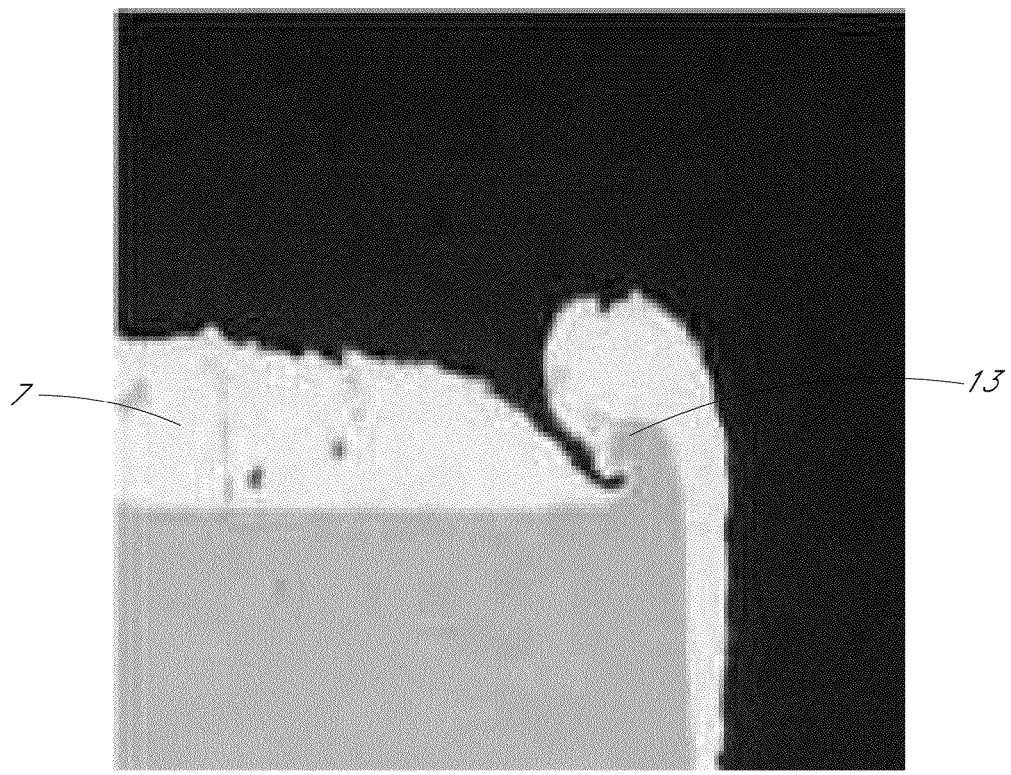
FIGS. 1D is a micrograph illustrating a plating layer applied over a sawed surface.

Plating after singulation would be much more difficult and expensive, if at all possible, not only because individual cells would need to be coated, but also because electrical connectivity among all the leads is lost upon singulation, making electroplating difficult or impossible. Moreover, even if plating were provided after singulating, e.g., through the use of an electroless process, the burrs 13 can also create problems when plating (or otherwise depositing) a conductive layer onto the sawed surface, as depicted in the micrograph of FIG. 1D. As mentioned above, the plating 7 can be applied to portions of the leads to enhance the solderability of the leads (and die attach pad) to the corresponding contact pads on the system substrate. Yet when the plating 7 is applied over the burrs 13 created during saw singulation, the plating 7 may be applied unevenly over the sawed surface, and there may be gaps in the plating 7 at the burrs 13. In addition, because the burrs 13 can often extend or curl away from the sawed surface, during solder reflow, the burrs 13 can create undesirable standoff between the plating 7 and the leadframe. In some cases, the standoff created by the burrs can decrease the reliability of the solder joint between the system substrate and the package. Moreover, when the plating 7 and/or solder is applied over the burrs 13, the resultant added mass can break off from the sawed surface, creating further gaps and unevenness in the plating 7, which can reduce the strength and reliability of the solder that bonds to the portions of the plating 7 applied over the burrs 13.

As a result, if the outer ends 12 of the leads 4 in an integrated device package 1 are sawed during singulation and before plating, the resulting burrs 13 can inhibit the application of a smooth, uniform plating layer and/or the formation of a strong and reliable solder bond with the outer ends 12. In turn, visual or optical inspection of the solder on the sawed outer ends 12 may not accurately reflect the strength of the solder bonds on the bottom surfaces 10 of the leads 4. It can therefore be advantageous to provide smooth outer ends 12 of the leads 4, in order to apply a reliable plating 7 for improving the solder bonds with the outer ends 12. Further advantages are obtained by providing such plating on smooth end surfaces prior to singulation, such that plating (including electroplating) can be conducted for an entire leadframe array.

FIG. 2A is a side cross-sectional view of a partially fabricated integrated device package 1. At the outset, it should be appreciated that the partially fabricated package 1 of FIGS. 2A-5E can be fabricated from a leadframe having an array of multiple leadframe device cells. For example, the partially fabricated package 1 of FIG. 2A illustrates only one leadframe device cell 14 within an array of multiple device cells. In particular, FIG. 2A illustrates an unpatterned leadframe device cell 14. Skilled artisans will appreciate that the leadframe (and leadframe device cell 14) can be made of any suitable conductor, such as copper (Cu). The leadframe can have a top surface 16 and a bottom surface 15 opposite the top surface 16. The leadframe can have any suitable thickness; in some implementations, the leadframe can be between about 100 μm and about 500 μm thick. For example, in some embodiments, the leadframe can be between about 150 μm and about 250 μm thick.

Turning to FIG. 2B, the bottom surface 15 of the leadframe can be selectively masked by an etch mask layer 17. The etch mask layer 17 can be formed of a material selected to protect the underlying material from being etched by an etchant selected to form the recessed regions in FIG. 2C described below. In some implementations, for example, the etch mask layer 17 can be formed of nickel (Ni) or NiPdAu, however other materials are possible (e.g., including polymers), depending upon the materials of the leadframe and the selective etchants available. In addition, the top surface 16 of the leadframe can be plated in a pattern (or alternatively plated as a solid layer and later patterned) to define a die attach pad region 23 and multiple lead regions 24 under and aligned with a topside plating layer 18. Alternatively, the top surface 16 can be masked with a masking layer (which may or may not be the same material as etch mask layer 17), and can be plated in a subsequent plating step. Note that throughout the application, "die attach pad region" and "lead region" may be used to denote the intermediate regions formed in the leadframe that will ultimately become a die attach pad and a lead, respectively, in a package.

The topside plating layer 18 can be formed of any suitable electrically conductive material, including, e.g., precious metals. For example, in some embodiments, the plating layer 18 can include one or more layers of a conductive material. In one embodiment, the plating layer 18 can be formed of a nickel-palladium-gold (NiPdAu) plating layer. In other embodiments, the plating layer 18 can be formed from other materials, including, e.g., a nickel-palladium-gold-silver (NiPdAuAg) plating layer, a nickel-palladium (NiPd) plating layer, a tin (Sn) plating layer, a tin-lead (SnPb) plating layer, a gold (Au) plating layer, and a silver (Ag) plating layer. It should be appreciated that the plating layer 18 can include multiple plating layers. Moreover, other suitable plating materials are possible.

Turning to FIG. 2C, the leadframe can be simultaneously etched through both the plated (or masked) top surface 16 and the masked bottom surface 15 of the leadframe. The etch can be performed using a wet etch process and can employ any etchant that is suitable to etch the unmasked portions of the leadframe. In embodiments using a copper leadframe with a NiPdAu mask layer 17, for example, suitable etchants include ammonium chloride. In yet other embodiments, a dry or plasma etching process can be used. Also, in other implementations, the top surface 16 and the bottom surface 15 need not be etched substantially simultaneously. For example, the plated or masked top surface 16 can be etched first using a first etchant, and the masked bottom surface 15 can be etched second using a second etchant, which may or may not be the same etchant as the first etchant. Alternatively, the bottom surface 15 can be etched first using a first etchant, and the top surface 16 can be etched second using a second etchant, which may or may not be the same etchant as the first etchant.

Figure 2E:
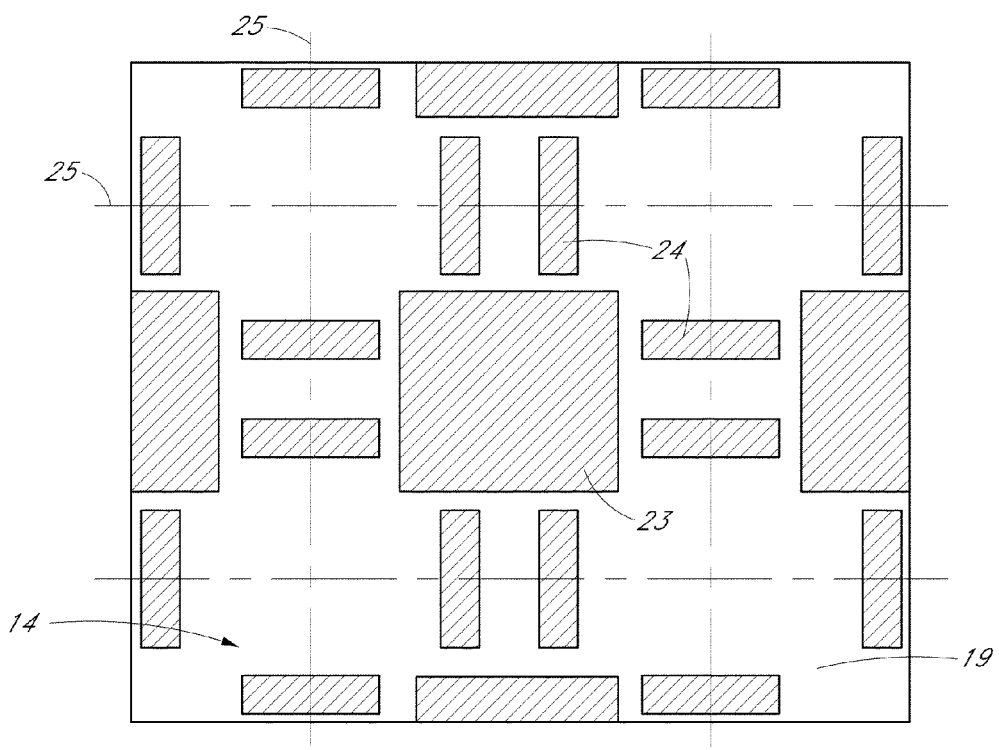
FIG. 2E is a top plan view of the leadframe device cell after etching a trench through a top surface.

In FIG. 2C, the top surface 16 can be etched at least partially through the thickness of the leadframe to define the lead regions 24 and the die attach pad regions 23, which remain connected to one another by thinned portions of the leadframe. FIG. 2E illustrates a top plan view of the leadframe device cell 14 of FIG. 2C after etching trenches 19 through the top surface 16. As noted above, the etching can be performed on multiple leadframe device cells within the leadframe array. As illustrated in FIGS. 2C and 2E, the lead regions 24 and the die attach pad regions 23 are formed by etching the trenches 19 that surround the die attach pad regions 23. The lead regions 24 are positioned around at least a portion of the perimeter of the die attach pad region 23. In addition, the trenches 19 extend between adjacent lead regions 24.

Figure 2F:
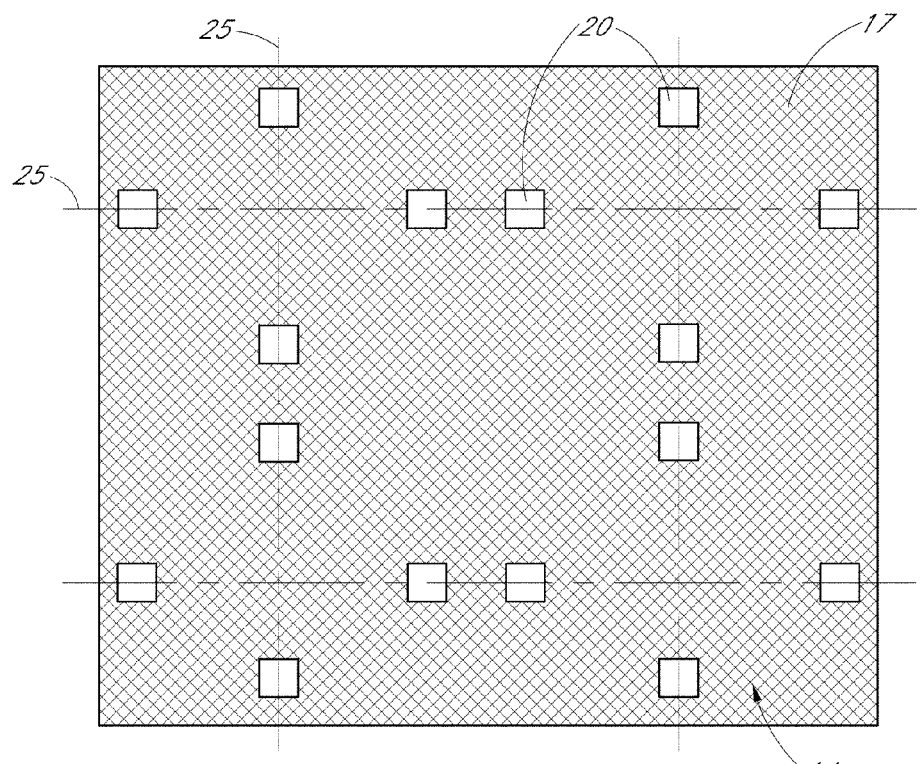
FIG. 2F is a bottom plan view of the leadframe device cell of FIG. 2C after etching through a bottom surface.

While the etch through the top surface 16 of the leadframe can be used to define the die attach pad regions 23 and lead regions 24 for the leadframe array, the etch through the masked bottom surface 15 of the leadframe can define a plurality of recessed regions 20 through the bottom side of the lead regions 24. The recessed regions 20 roughly define portions of the outer ends of each lead 4 in the completed package 1, although a subsequent plating will modify the surfaces exposed at this stage. FIG. 2F illustrates a bottom plan view of the leadframe device cell 14 of FIG. 2C after etching through the bottom surface 15, demonstrating that the leadframe remains intact at this stage of processing. As shown in FIGS. 2C and 2F, the recessed regions 20 can be formed by etching partially through the leadframe thickness. For example, in some implementations, the recessed region 20 can be etched through less than about 50% of the leadframe thickness. For example, the recessed regions 20 can be etched through between about 15% and about 50% of the leadframe thickness, more particularly between about 30% and about 50% of the leadframe thickness. In other embodiments, the recessed regions can be etched through more than 50% of the leadframe thickness. In FIG. 2F, the recessed regions 20 are illustrated as substantially square in shape, but the recessed regions can also be rectangular, circular, or any other suitable shape. As will be described in more detail below with respect to FIGS. 2G-2H, the recessed regions 20 can generally be formed at the boundary between adjacent lead regions in neighboring leadframe device cells. The boundary separating neighboring leadframe device cells is illustrated by saw streets 25, along which the leadframe will be singulated into multiple packages. The recessed regions 20 can be sized to extend substantially across the entire width of each overlying lead region.

The etch used to form the recessed regions 20 in the bottom surface 15 of the leadframe can use any suitable etchant and/or etch process, including a wet etch process, a dry etch process, or a plasma etch process. In some embodiments, the etch of the recessed regions 20 can be an anisotropic etch, in which case the etched sidewalls of the recessed region 20 can be substantially vertical. In other embodiments, however, the etch of the recessed region 20 can be an isotropic wet etch, which is more economical, in which case the etched sidewalls of the recessed region can form an angle with the bottom surface 15 of the leadframe. As illustrated in FIG. 2D, etching the recessed regions 20 can form sloped sidewalls 21 and can form an etched surface 22 at the top of the etched sidewall 21. The sloped sidewalls 21 can form an angle θ with the bottom surface 15 of the leadframe. The angle θ can vary according to the etchant and the material to be etched. Skilled artisan will appreciate that any suitable etchant can be used for an isotropic etch, depending on the particular set of materials. Accordingly, the angle of the etched sidewalls may likewise vary according to the materials and etchant used.

One important characteristic resulting from etching the recessed regions 20, as opposed to sawing, punching, or using another material removal method, is that the etched sidewalls 21 and/or planar surface 22 can be substantially smooth. For example, the etched surfaces can be substantially free of burrs 13 that result when sawing through the leadframe. Moreover, the angle θ, as illustrated in FIG. 2D, may be angled outwardly, such that after singulation, the angle θ is angled outwardly away from the outer ends 12 of the leads 4. However, in other embodiments, the angle 8 may be inwardly angled or substantially vertical, depending on the etching technique employed. For inwardly angled etch angles θ, the sidewalls of the lead portions may have a reentrant profile, which can in some arrangements be advantageous in securing encapsulant or molding material to the leadframe. Skilled artisans will understand that various etching techniques and the resulting etch angles θ may vary.

After etching the recessed regions 20, the masking layer 17 can be stripped from the bottom surface 15 of the leadframe, except from the areas underlying the trench 19, as illustrated in FIG. 2G. The masking layer 17 can thereby form a mask that exposes the bottom side of the lead regions 24 (including the recessed regions 20 underlying a portion of each lead region 24) and the bottom side of the die attach pad regions 23 of the leadframe. The unmasked regions on the bottom surface 15 of the leadframe can then be plated with bottomside plating layer 7. The bottomside plating layer 7 can be formed of any suitable plating layer, including the materials discussed above with respect to the topside plating layer 18 of FIG. 2B. The bottomside plating layer 7 can be plated with any suitable plating technique, including, e.g., electroplating or electroless plating.

FIG. 2H is a bottom plan view of the leadframe device cell 14 after applying the bottomside plating layer 7 to the unmasked bottom surface 15 of the leadframe, e.g., the bottom sides of the lead regions 24 and die attach pad regions 23. As illustrated in FIGS. 2G-2H, the bottomside plating layer 7 can also plate internal surfaces of the recessed regions 20. Because the recessed regions 20 can be free of burrs that would otherwise be present if the regions were sawed, the bottomside plating layer 7 can be smoothly applied over the recessed regions 20, such that there is no or minimal standoff, and such that there are no or few gaps in the plating layer 7, as compared to a sawed or cut surface.

As best seen in FIG. 2H, the plated recessed regions 20 can be formed at boundaries between adjoining lead regions 24 in neighboring leadframe device cells 14, the boundaries of which are shown in dashed lines representing saw streets 25. The recessed regions 20 can extend across the entire width of the lead regions 24. For example, FIG. 2H illustrates the leadframe device cell 14 and four neighboring leadframe device cells numbered 14*a*, 14*b*, 14*c*, and 14*d*, respectively. Only portions of the four neighboring device cells 14*a*-*d* are illustrated in FIG. 2H. During fabrication, the lead regions 24 of the leadframe device cell 14 can adjoin lead regions 24*a* of neighboring leadframe device cell 14*a*, lead regions 24*b* of neighboring leadframe device cell 14*b*, lead regions 24*c* of neighboring leadframe device cell 14*c*, and lead regions 24*d* of neighboring leadframe device cell 14*d*, respectively. As illustrated, the recessed regions 20, which are plated in FIG. 2H, can be formed in the bottom surface 15 of the leadframe at the boundaries between the adjoining lead regions in neighboring leadframe device cells 14. After plating the bottom surface 15 of the leadframe, the masking layer 17 can be stripped from the bottom surface to expose portions of the leadframe that underlie the trenches 19.

Turning to FIG. 2I, an integrated device die 9 can be mounted on the die attach pad region 23, and can electrically connect to the lead regions 24 via wire bonds 5. In addition, a package body 6 can be applied over the leadframe to encapsulate the integrated device die(s) 9, the wire bonds 5, the topside plating layer 18, and/or the top surface 16 of the leadframe. The integrated device die 9, wire bonds 5, and package body 6 can be configured as described above with respect to FIGS. 1A-1B. As illustrated in FIG. 2I the package body 6 can comprise a molding material that encapsulates the die 9 and wire bonds 5. Note also that, in FIG. 2I, the molding material fills the trench 19 that separates the die attach pad region 23 from the lead regions 24. In addition, the masking layer 17 can be removed from the region underlying the trench 19 to expose the leadframe material.

FIG. 2J is a side cross-sectional view of the leadframe device cell 14 after removing portions of the leadframe that underlie the trench 19. After mounting the die 9 and applying the package body 6 (e.g., a molding material is illustrated in FIGS. 2I and 2J), the leadframe material underlying the trench 19 (filled with molding material in FIG. 2I) can be completely removed to electrically and physically isolate the die attach pad regions 23 from the lead regions 24, thereby forming a die attach pad 3 electrically isolated from a plurality of leads 4. In the embodiment of FIG. 2J, the material underlying the trench 19 can be removed by, e.g., etching the leadframe material with a suitable etchant and technique as described above. As shown by FIG. 2J, the etchant can completely remove the leadframe material underlying the trench 19, until the etchant reaches the molding material within the trench 19. In some implementations, for example, for a copper leadframe (although other materials are possible), sulphuric acid and/or ammonium chloride can be used to etch the leadframe material. Skilled artisans will understand that other etchants may be suitable as well. In the embodiment of FIG. 2J, the bottomside plating layer 7 can act as an etch mask when etching the leadframe material underlying the trench 19, and the package body 6 can act as an etch stop. A skilled artisan would appreciate, however, that other suitable etch masks can be used in other arrangements.

Figure 2K:
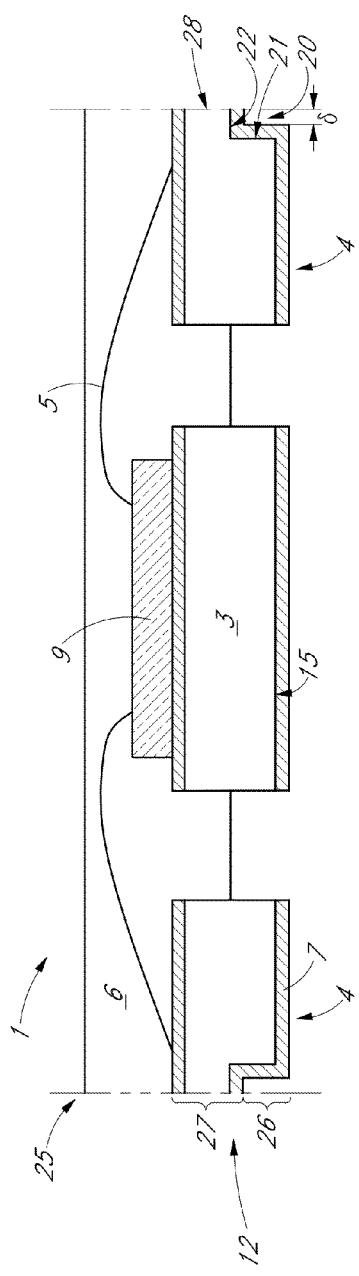
FIG. 2K is a side cross-sectional view of an integrated device package after singulation.
Figure 2L:
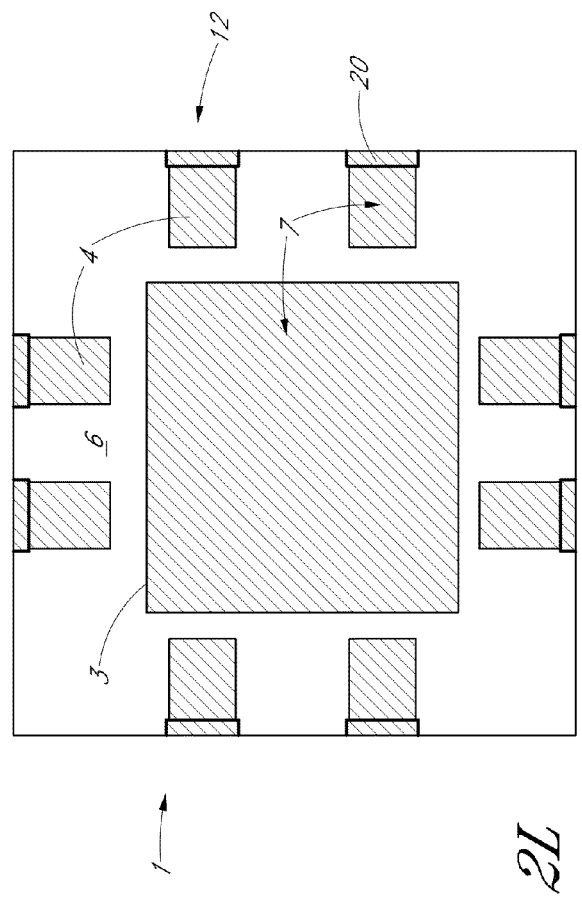
FIG. 2L is a bottom plan view of the integrated device package after singulation.

Moreover, as illustrated in FIG. 2K, the leadframe can be separated into multiple, independent integrated device packages 1. For example, the integrated device package 1 of FIG. 2K can be formed by sawing along saw streets 25 illustrated in FIGS. 2I and 2J to singulate the leadframe into multiple packages 1. FIG. 2L illustrates a bottom plan view of the package 1 shown in FIG. 2K. As shown in FIGS. 2K and 2L, the plated bottom surface of each lead 4 and the plated bottom surface of the die attach pad 3 can be exposed through the package body 6. The exposed portions of the bottom surface of each lead 4 (and also the die attach pad 3 in some arrangements) can include the plating layer 7 that can improve the bonding of the leads 4 to a system substrate, particularly when solder is used to couple the leads 4 (and die attach pad 3) to the system substrate.

In addition, as shown best in FIG. 2K, the outer ends 12 of each lead 4 can include an etched lower portion 26 and an upper portion 27. The etched lower portion 26 can extend across substantially the entire width of each lead 4. The bottomside plating layer 7 can also extend across the entire width of the etched lower portion 26, in addition to the exposed portions of the bottom surface 15 of each lead 4. The upper portion 27 can extend over the etched lower portion by an overhang length δ. The overhang length δ can be caused by sawing along saw streets 25 that are offset from the lead sidewall surfaces 21 that were defined by the etch of the recess 20 prior to plating. Offsetting the saw streets 25 from the sidewall surfaces 21 can be advantageous in avoiding damage to the plating layer 7 and/or the etched sidewall surface 21. The overhang length δ can be designed to be sufficiently small to avoid obscuring the outer ends 12 during optical inspection of the solder joints. For example, in some embodiments, the overhang length δ can be between about 10 μm and about 50 μm.

The etched lower portion 26 can include the etched sidewall surface 21. The lead 4 can also include the etched bottom surface 22 of the upper portion 27, which can be formed at an angle with the sidewall surface 21 as shown in FIG. 2D. The etched bottom surface 22 of the upper portion 27 can also be plated with the bottomside plating layer 7 to further enhance solder bonding to the outer ends 12 of the leads 4. When the leadframe is saw singulated, the upper portion 27 can include a sawed end surface 28. As shown in FIG. 2K, the sawed end surface 28 can be angled upwardly from the etched bottom surface 22. Also, as illustrated in FIG. 2D above, the etched sidewall 21 of the lower portion 26 can be angled outwardly from the bottom surface 15 of the lead 4, e.g., by an angle θ (not shown in FIG. 2K).

When the package 1 is soldered to a system substrate 14, the solder can reflow up the outer ends 12 of each lead 4 to reliably bond with the plating layer 7 formed on the etched lower portion 26 (e.g., including over the etched sidewall surfaces 21), which can extend across the entire width of each lead 4. In some embodiments, the solder can also reliably bond with the plating layer 7 formed on the etched bottom surface 22 of the upper portion 27 of the outer ends 12 of the leads 4. Because the etched surfaces 21, 22 are substantially free of burrs, the plating layer 7 can be applied evenly over the etched surfaces 21, 22, without risking standoff or break-off due to any burrs. The solder can thereby reliably and consistently bond to the outer ends 12 of the lower portion 26 of the leads 4 (also including the etched bottom surface 22 of the upper portion 27).

Turning to FIG. 3A, another embodiment of a partially fabricated integrated device package is illustrated. Unless otherwise noted, reference numerals generally refer to components similar to those illustrated in FIGS. 1A-2L above. FIG. 3A is a side cross-sectional view of a leadframe device cell 14. As above, the bottom surface 15 of the leadframe can be patterned with a masking layer 17 such that the regions that will become the recessed regions 20 are unmasked. The unmasked regions on the bottom surface 15 of the leadframe device cell 14 can be etched partially through the thickness of the leadframe to form recessed regions 20. FIG. 3B illustrates a side cross-sectional view of the leadframe device cell 14 after etching the recessed regions 20, while FIG. 3C illustrates a bottom plan view of the device cell 14 of FIG. 3B. Unlike FIG. 2C, in this embodiment, only the bottom surface 15 of the leadframe is etched initially to form the recessed regions 20.

Figure 3D:
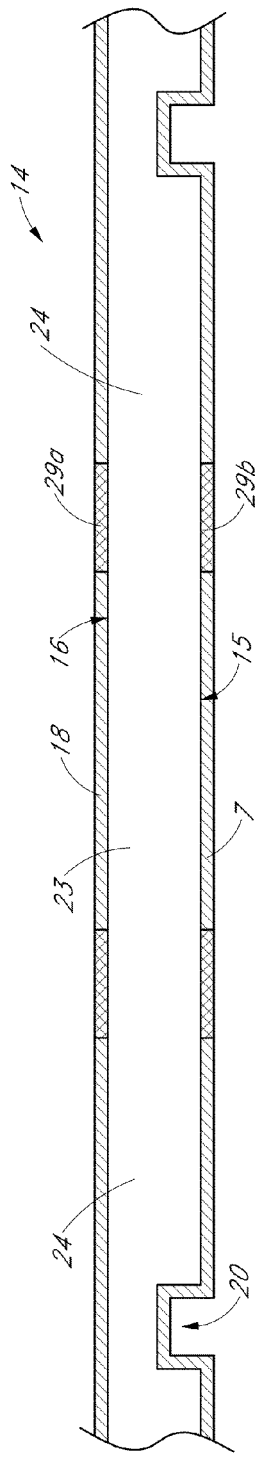
FIG. 3D is a side cross-sectional view of the leadframe device cell after plating.
Figure 3E:
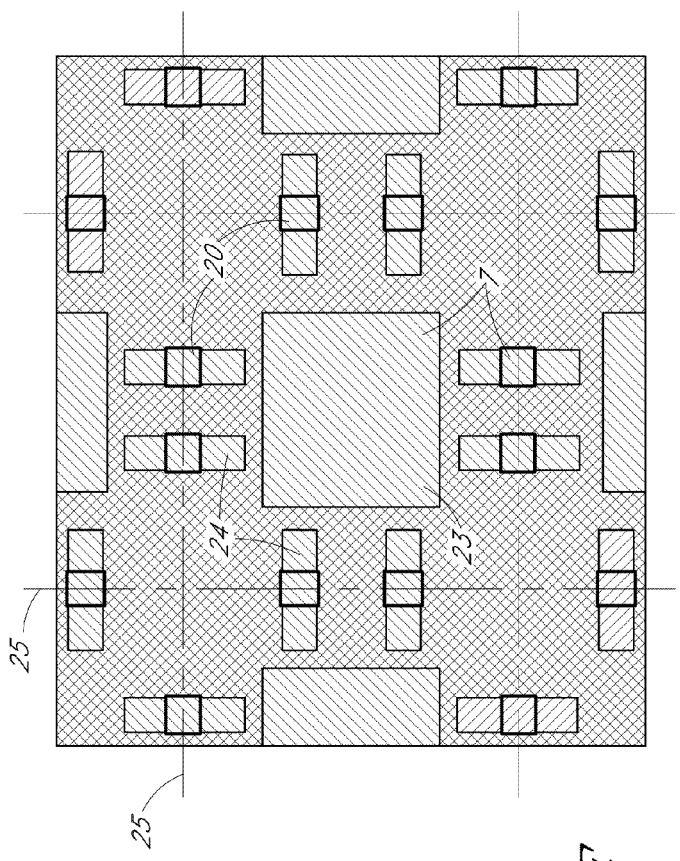
FIG. 3E is a bottom plan view of the embodiment illustrated in FIG. 3D.

FIG. 3D is a side cross-sectional view of the leadframe device cell 14 after plating the top and bottom surfaces of the leadframe. Before plating, the masking layer 17 can be stripped from the leadframe or modified. Top masking layer 29a and bottom masking layer 29b can be applied to the top and bottom surfaces 16, 15, respectively. The top masking layer 29a and the bottom masking layer 29b can be applied in a pattern such that lead regions 24 and die attach pad regions 23 are unmasked. A bottomside plating layer 7 can be applied to the bottom surface 15 of the leadframe, and a topside plating layer 18 can be applied to the top surface 16. As above, the bottomside plating layer 7 can be applied to the internal surfaces of the recessed regions 20. FIG. 3E illustrates a bottom plan view of the embodiment illustrated in FIG. 3D.

Figure 3F:
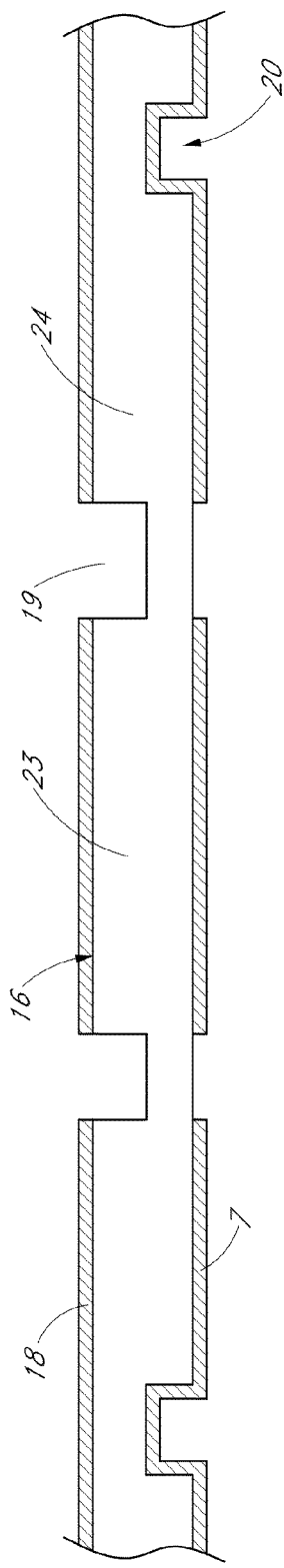

In FIG. 3F, the top masking layer 29a can be removed to expose portions of the leadframe that define the die attach pad region 23 and the lead regions 24. The top surface 16 of the leadframe can then be etched partially through the thickness of the leadframe to form a trench 19 that surrounds the die attach pad regions 23 and that separates adjacent lead regions 24. In this embodiment, the topside plating layer 18 can act as an etch mask such that the etchant selectively etches the trench 19. The bottom masking layer 29b can remain during the etch and can be stripped afterwards.

Figure 3G:
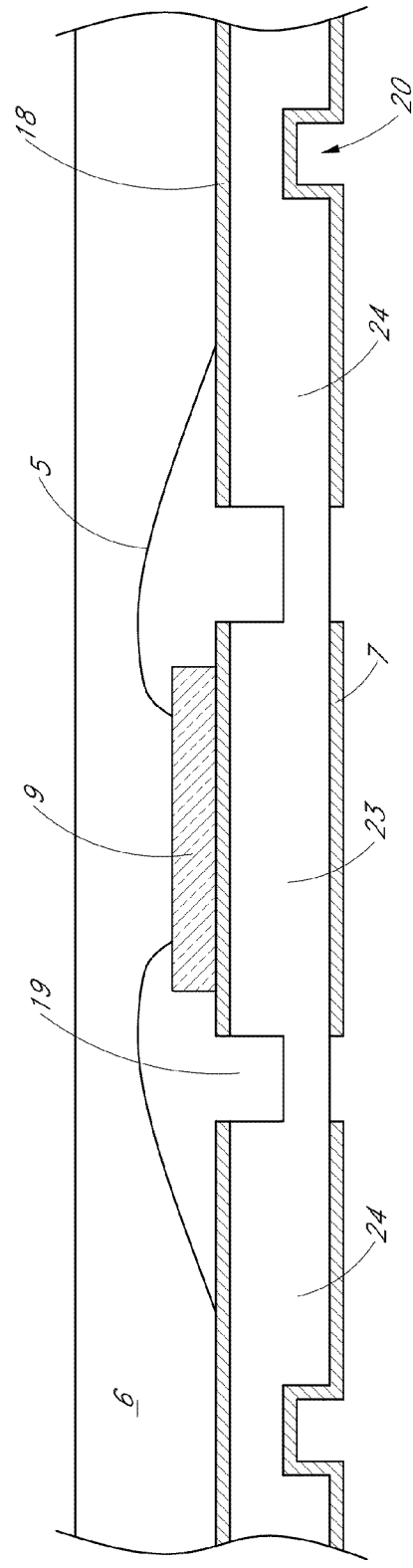

As shown in FIG. 3G, an integrated device die 9 can be mounted onto the die attach pad region 23. The die 9 can be wire bonded to the lead regions 24 using wire bonds 5. A package body 6 can be applied over the die 9 and wire bonds 5. In the embodiment, illustrated in FIG. 3G, the package body 6 is a molding material that encapsulates the die 9, wire bonds 5, the lead regions 24, and the die attach pad region 23.

FIGS. 3H and 3I are side cross-sectional views of the leadframe device cell 14. The embodiments of FIGS. 3H and 3I can be obtained using steps similar to those described above with respect to FIGS. 2J-2L. As illustrated in FIG. 3H, the portions of the leadframe that underlie the trench 19 can be removed by, e.g., etching through the leadframe portions that are unmasked by the bottomside plating layer 7. The portions of molding material filling the trench 19 can act as an etch stop to terminate the etch. In FIG. 3I, the leadframe device cell 14 can be singulated by sawing along saw streets 25 to form separate integrated device packages 1. As with the embodiment of FIGS. 2K-2L, the etched sidewall 21 of the lower portion 26 of the outer ends 12 of the leads 4 can be angled outwardly from the bottom surface 15 of the lead 4, e.g., by an angle θ as illustrated in FIG. 2D (not shown in FIG. 3I).

FIG. 4A illustrates another embodiment of a partially fabricated integrated circuit package. In FIG. 4A, the top surface 16 of the leadframe is plated with a topside plating layer 18 and a bottomside plating layer 7. The topside plating layer 18 can be applied to cover the lead regions 24 and the die attach pad region 23. Portions 30 of the top surface 16 overlying the regions that will ultimately form the recessed regions can remain unplated. Also, the bottom surface 15 of the leadframe can be patterned and plated with a bottomside plating layer 7 that covers the bottom surfaces of the lead regions 24 and the die attach pad region 23. Portions 32 of the bottom surface 15 underlying the regions that will ultimately form the recessed regions can remain unplated.

Turning to FIG. 4B, portions of the top surface 16 and the bottom surface 15 can be masked by masking layers 33 and 34, respectively. The top masking layer 33 can be applied over portions on the top surface 16 of the leadframe opposite the regions that will ultimately form the recessed regions 20. The bottom masking layer 34 can be applied over portions of the bottom surface 15 of the leadframe opposite the regions that will ultimately form the trench 19. The unmasked and unplated portions of the top surface 16 and the bottom surface 15 can be etched partially through the thickness of the leadframe to form the recessed regions 20 and the trench 19 that surrounds the die attach pad region 23 and that separates adjacent lead regions 24. The recessed regions 20 and trench 19 can be etched less than about 60% through the thickness of the leadframe. In some embodiments, the recessed regions 20 and trench 19 can be etched between about 30% and about 50% of the thickness of the leadframe. In some embodiments, the etch is performed for a time period sufficient to remove the desired amount of leadframe material from the trench 19 and recessed regions 20. The masking layers 33, 34 can be removed from the leadframe device area.

As in the above-described embodiments, in FIG. 4C the integrated device die 9 can be mounted on the die attach pad region 23, and can be electrically coupled to the lead regions 24 by wire bonds 5. In addition, as illustrated in FIG. 4C, jump bonds 31 can be used to electrically couple the lead regions 24 to adjacent lead regions 24a, 24c in neighboring leadframe device areas. The jump bonds 31 can be gold bonding wires in some arrangements. In other arrangements, other types of electrical connections can be used.

Turning to FIG. 4D, the unplated portions of the leadframe device cell 14 can be etched to completely remove the leadframe material surrounding the die attach pad region 23 to form a die attach pad 3 surrounded by a plurality of separated leads 4. Moreover, the unplated recessed regions 20 of FIG. 4C can be completely etched to remove the remaining leadframe material at the boundary of neighboring leadframe device areas. Thus, as shown in FIG. 4D, the entire outer ends 12 of the leads 4 can be etched, whereas only the lower portion 26 of the outer ends 12 are etched in FIGS. 2A-3F-2.

In FIG. 4E, the entire outer ends 12 of the leads 4 can be plated with a sidewall plating layer 7a. In the embodiment illustrated in FIG. 4E, the jump bonds 31 are used to maintain electrical connectivity during the plating. Jump bonds 31 can electrically connect leads 4 in the leadframe device cell 14 with adjoining leads 4a, 4c, respectively, in neighboring leadframe device cells across the leadframe array. The etch process of FIG. 4D separated the leads 4 from the adjoining leads 4a, 4c, which would prevent a subsequent electroplating step without another electrical connection. The jump bonds 31 thereby provide the electrical connection between adjoining leads in neighboring leadframe device cells to enable the electroplating of the sidewall plating layer 7a across the entire height and width of the outer ends 12 of the leads 4. For example, electrical current can flow to every lead 4 by way of jump bonds 31 to enable plating the outer ends 12 of the leads to form the sidewall plating layer 7a. Similarly, the sidewall plating layer 7a can coat inner end and side surfaces 37 of the leads 4. The sidewall plating layer 7a can be formed from the same plating material as the bottomside plating layer 7, but in other arrangements, the two plating layers can be formed of different materials or combinations.

Figure 4F:
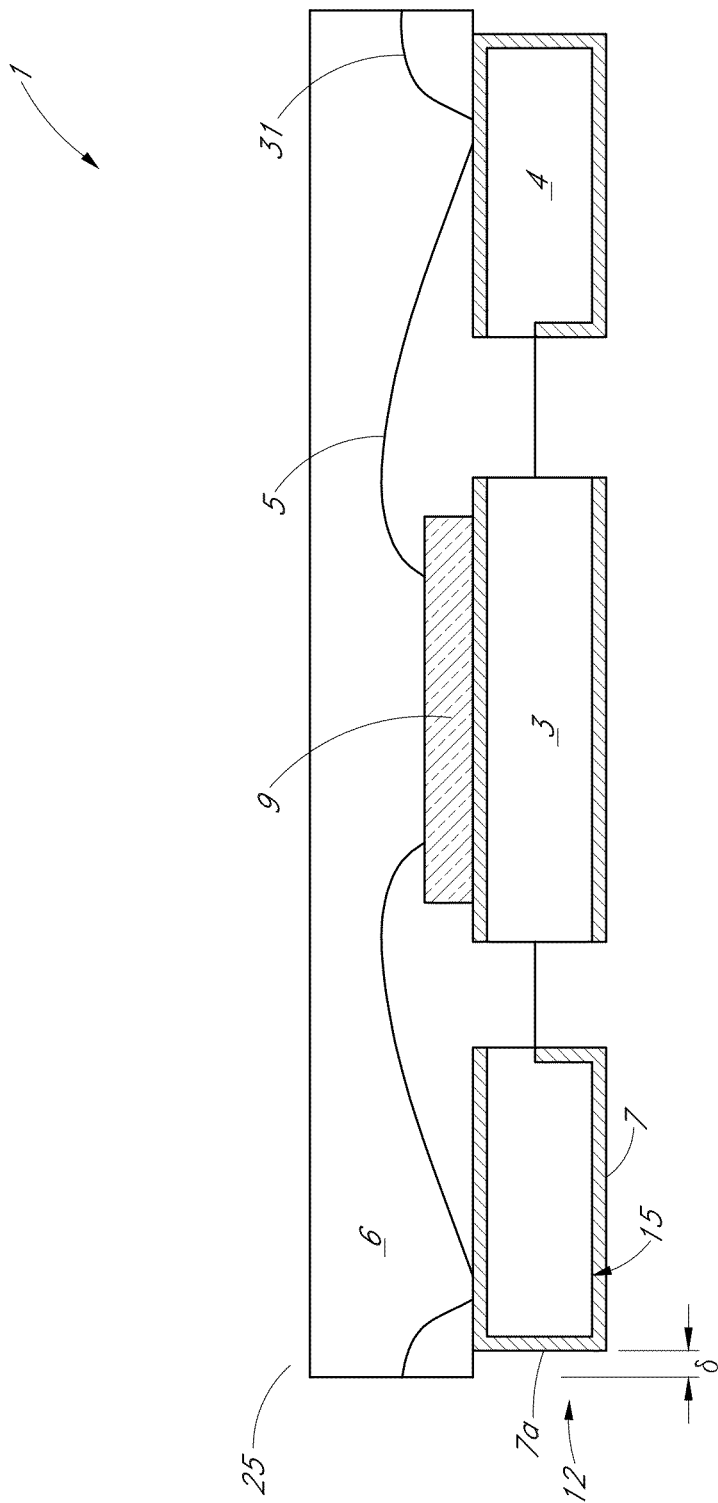
FIG. 4F is a side cross-sectional view of an integrated device package after singulating the leadframe device cell of FIG. 4E.

After plating the outer ends 12 of the leads 4, the leadframe can be singulated by sawing along saw streets 25 to electrically and physically separate the leadframe into multiple integrated device packages 1. Singulation can also cut through the jump bonds 31. As illustrated in FIG. 4F, a portion of the jump bonds 31 can remain embedded within the final package 1. The portion of the jump bond 31 embedded in the package 1 can comprise a bonding wire extending from one of the leads to an outer perimeter of the package body 6. As shown in FIG. 4F, the entire outer end 12 of the leads 4 can thus be etched and plated with a plating material. As with the embodiments of FIGS. 2K-2L and 31, the etched sidewalls of the outer ends 12 of the leads 4 can be angled outwardly from the bottom surface 15 of the lead 4, e.g., by an angle θ as shown in FIG. 2D (not shown in FIG. 4F). As above, the plated outer ends 12 allow for more effective optical inspection of solder that bonds to the plating material on the outer ends 12. Moreover, as shown, the package body 6 need not be flush with the outer ends 12 of the leads 4, since they were independently separated, and the body 6 is shown overhanging the plated outer ends 12 of the leads 4. In particular, as shown, an outer perimeter of the package body overhangs the outer end 12 of each lead 4.

FIG. 5A illustrates another embodiment of a partially fabricated integrated device package. Similar to FIG. 4B above, a topside plating layer 18 can be applied on the top surface 16 of the leadframe, and a bottomside plating layer 7 can be applied on the bottom surface 15 of the leadframe. In addition, a trench 19 can be etched to surround the die attach pad region 23 and to extend between the die attach pad region 23 and the lead regions 24. The trench 19 can also extend between adjacent lead regions 24. Moreover, as above, recessed regions 20 can be etched partially through the thickness of the leadframe. Unlike FIG. 4A, however, the topside plating layer 18 of FIG. 5A extends over regions 41 that overlie the recessed regions 20, e.g., the portions at the boundary between adjacent leadframe device cells.

As in the above-described embodiments, and as shown in FIG. 5B, an integrated device die 9 can be mounted on the die attach pad region 23, and can electrically connect to the lead regions 24 by way of wire bonds 5. A package body 6 (e.g., a molding material as shown in FIG. 5B) can be applied over the die 9 and wire bonds 5.

In FIG. 5C, the recessed regions 20 can be further etched through the entire thickness of the leadframe. The portions of the topside plating layer 18 in the regions 41 overlying the recessed regions 20 can act as an etch stop. Thus, after etching through the entire thickness of the leadframe, the recessed regions 20 can be made deeper such that they extend all the way through the leadframe to the bottom of the topside plating layer 18. In addition, as above, the unplated portions of the leadframe underlying the trench 19 can be completely etched to electrically and physically separate the leads 4 from the die attach pad 3.

Turning to FIG. 5D, the interior surfaces of the recessed regions 20 can be plated with sidewall plating layer 7a, similar to the embodiment illustrated in FIG. 4E. Unlike FIG. 4E, however, the embodiment of FIG. 5D does not employ jump bonds. Rather, the sidewall plating layer 7a can be electroplated onto the etched surfaces using the topside plating layer 18 to electrically couple the leads 4 with adjoining leads 4a, 4c in neighboring leadframe device cells.

Figure 5E:
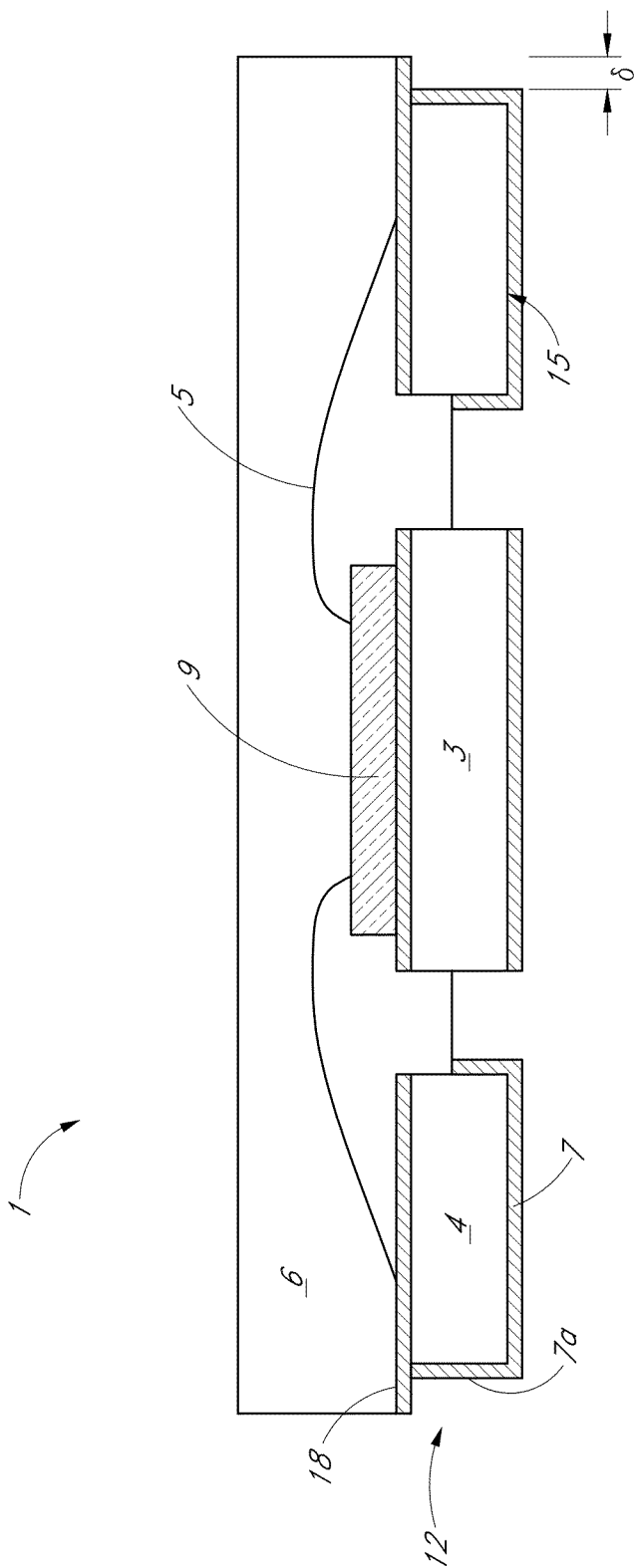
FIG. 5E is a side cross-sectional view of an integrated device package after singulating the leadframe device cell of FIG. 5D.

The leadframe can be singulated to form separate integrated device packages 1, as shown in FIG. 5E. As shown, the entire thickness or height of the outer ends 12 of the leads can be etched and plated with sidewall plating layer 7a (which can be the same as bottomside plating layer 7 in some embodiments). As with the embodiment of FIGS. 2K-2L, 31, and 4F, the etched sidewalls of the outer ends 12 of the leads 4 can be angled outwardly from the bottom surfaces 15 of the leads 4, e.g., by an angle θ as illustrated in FIG. 2D (not shown in FIG. 5E).

In addition, as shown, the package body 6 is not flush with the outer ends 12 of the leads 4. Rather, portions of the package body 6 and the topside plating layer 18 can overhang the outer ends 12 by the overhang length δ. In particular, an outer perimeter of the package body 6 can be substantially flush with an outer perimeter of the topside plating layer 18, and the outer perimeter of the topside plating 18 layer can overhang the outer end 12 of each lead 4. The sidewall plating layer 7a coating the entire outer end 12 of the leads 4 can thus improve the bonding of solder to the outer ends 12 of the leads, improving the reliability of solder fillet optical inspection systems.

While the above embodiments (e.g., FIGS. 2A-5E) illustrate a trench 19 that is etched only partially through the thickness of the leadframe, it should be appreciated that the etch step can also etch completely through the thickness of the leadframe, except for regions defining tie bars at the corner of each device cell, such that the die attach pad 3 is physically separated from the leads 4. In such implementations, one or more tie bars can be used to temporarily support the die attach pad 3 until fabrication is complete. The package body 6 (e.g., a molding material) can then be applied to the leadframe device cell 14 and can extend through the entire thickness of the leadframe such that the package body 6 is substantially flush with the bottom surface 15 of the leads 4, as opposed to filling only the trench 19. The etched recessed regions 20 can be plated in any suitable manner as described above, and the package can be singulated into individual integrated device packages.

Figure 6:
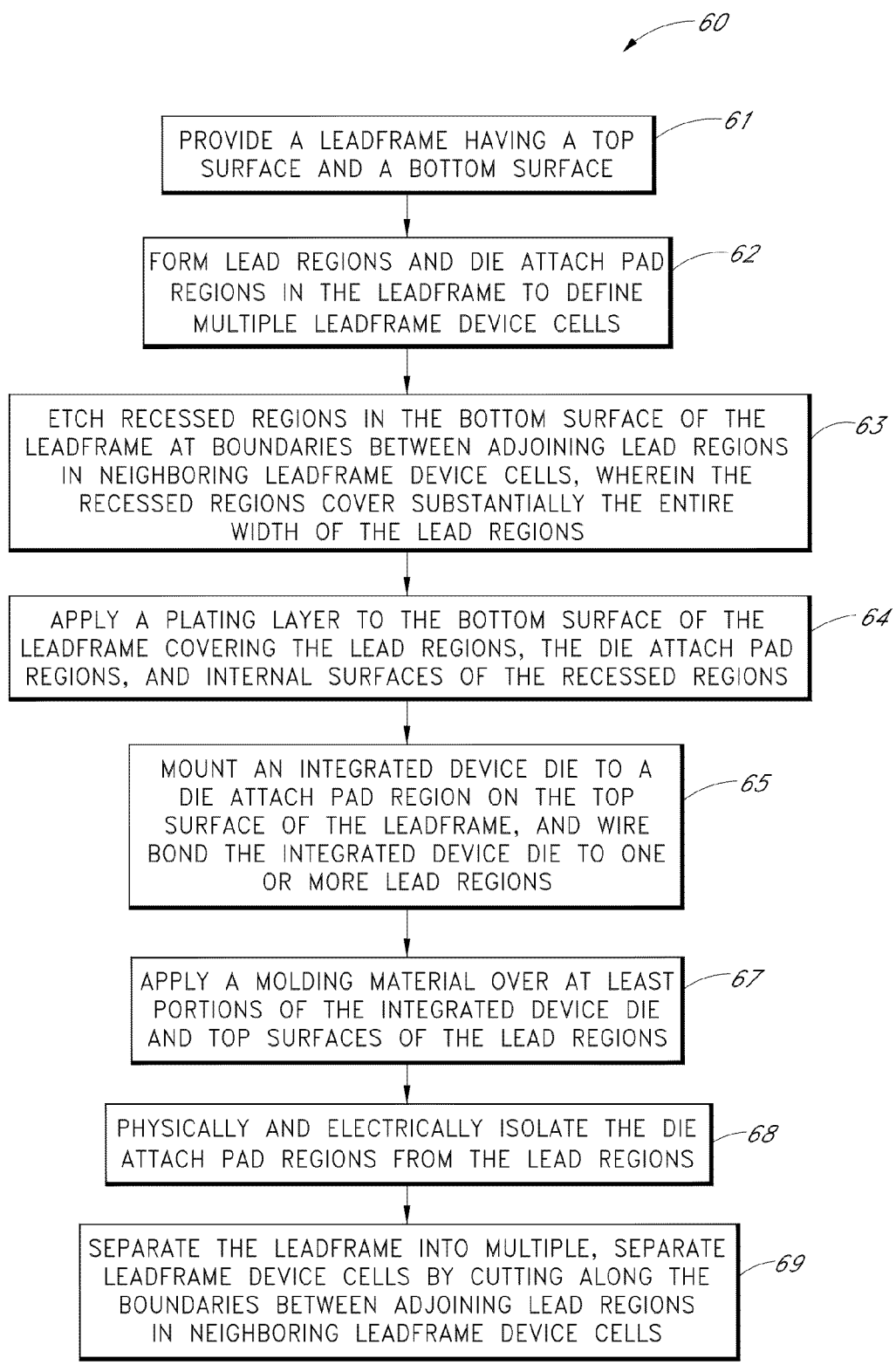
FIG. 6 is a flowchart illustrating a method for assembling an integrated device package, according to one embodiment.

FIG. 6 is a flowchart illustrating one method 60 for fabricating an integrated device package. In Block 61, a leadframe having a top and a bottom surface is provided. As above, the leadframe can be made of any suitable conductive material, such as copper. In Block 62, lead regions and the die attach pad regions are formed in the leadframe to define multiple leadframe device cells. As with the above implementations, the lead regions and the die attach pad region can be formed by etching a trench at least partially through the thickness of the leadframe. In other implementations, the etch can be performed through the entire thickness of the leadframe.

Turning to Block 63, recessed regions are etched in the bottom surface of the leadframe at boundaries between adjoining lead regions in neighboring leadframe device cells. The recessed regions can cover substantially the entire width of the lead regions. In some implementations, the recessed regions can cover the entire thickness (or height) and width of the lead regions. As described above, any suitable etch process can be used, including, e.g., a wet or dry etch process or a plasma etch process. Any suitable etchant can be used.

In Block 64, a plating layer is applied to the bottom surface of the leadframe to cover the lead regions, the die attach pad regions, and the internal surfaces of the recessed regions. As above, any suitable conductive plating material can be used. For example, in some implementations, the plating layer can be a nickel-palladium-gold (NiPdAu) plating layer. In other embodiments, the plating layer can be formed from other materials, including, e.g., a nickel-palladium-gold-silver (NiPdAuAg) plating layer, a nickel-palladium (NiPd) plating layer, a tin (Sn) plating layer, a tin-lead (SnPb) plating layer, a gold (Au) plating layer, and a silver (Ag) plating layer.

Turning to Block 65, an integrated device die is mounted to a die attach pad region on the top surface of the leadframe. The integrated device die can be electrically coupled to the lead regions by way of, e.g., wire bonds. As above, the integrated device die can be any suitable die, including, e.g., integrated circuit dies and MEMS dies. In Block 67, a molding material can be applied over at least portions of the integrated device die and top surfaces of the lead regions. In some implementations, the molding material can be applied within a trench that can be formed in Block 62. In other implementations, the molding material can be applied and extend through the thickness of the leadframe such that the molding material is substantially flush with the bottom surfaces of the leads.

In Block 68, the die attach pad regions are physically and electrically separated from the lead regions. In some arrangements, the leadframe can be etched to physically and electrically separate the lead regions from the die attach pad regions. In Block 69, the leadframe is separated into multiple, separate leadframe device cells to form individual integrated device packages. The leadframe can be singulated by cutting or sawing along saw streets that define the boundaries between adjoining lead regions in neighboring leadframe device cells.

Figure 7A:
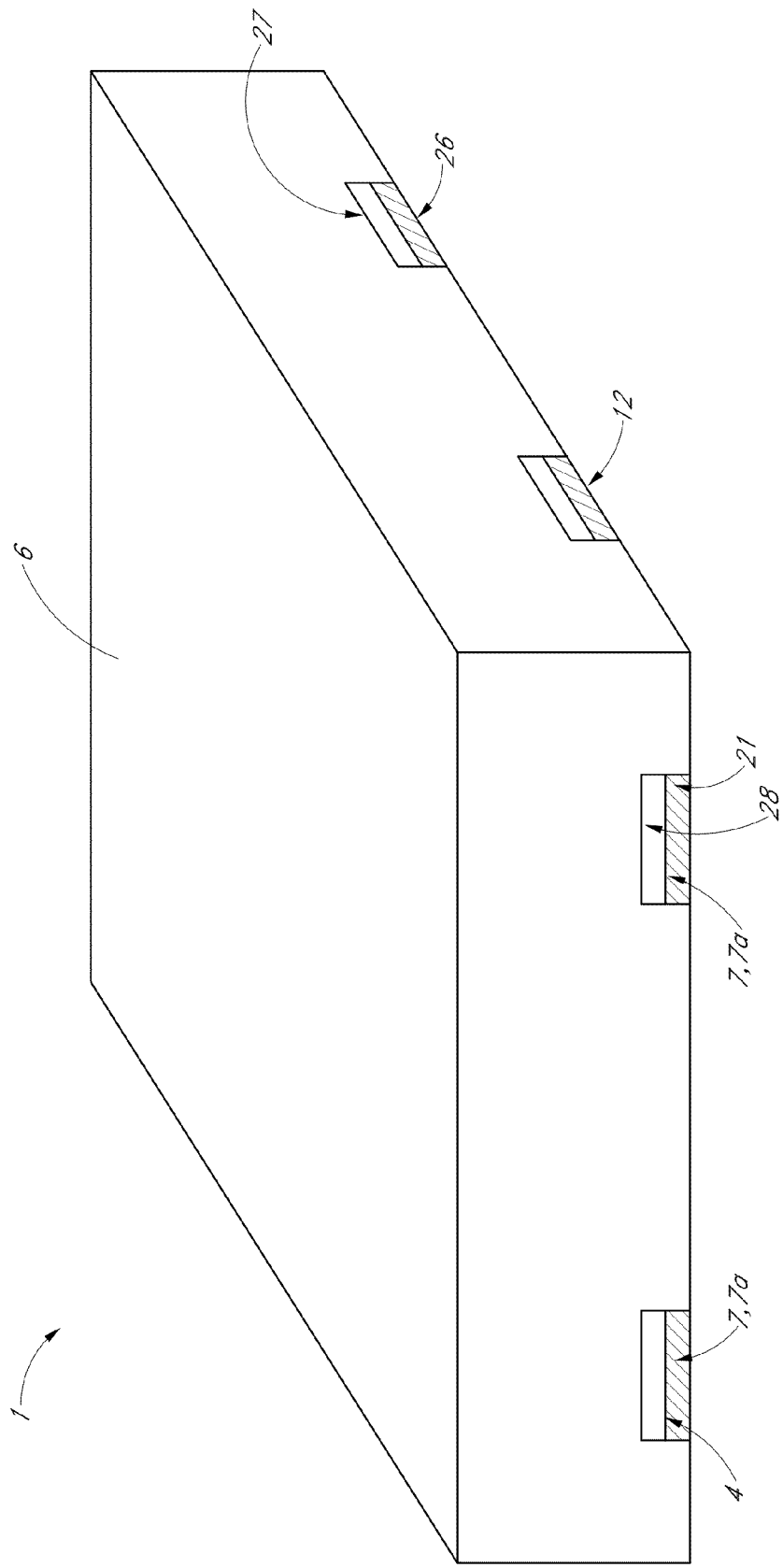
FIGS. 7A is a 3D perspective view of an integrated device package according to one embodiment.
Figure 7B:
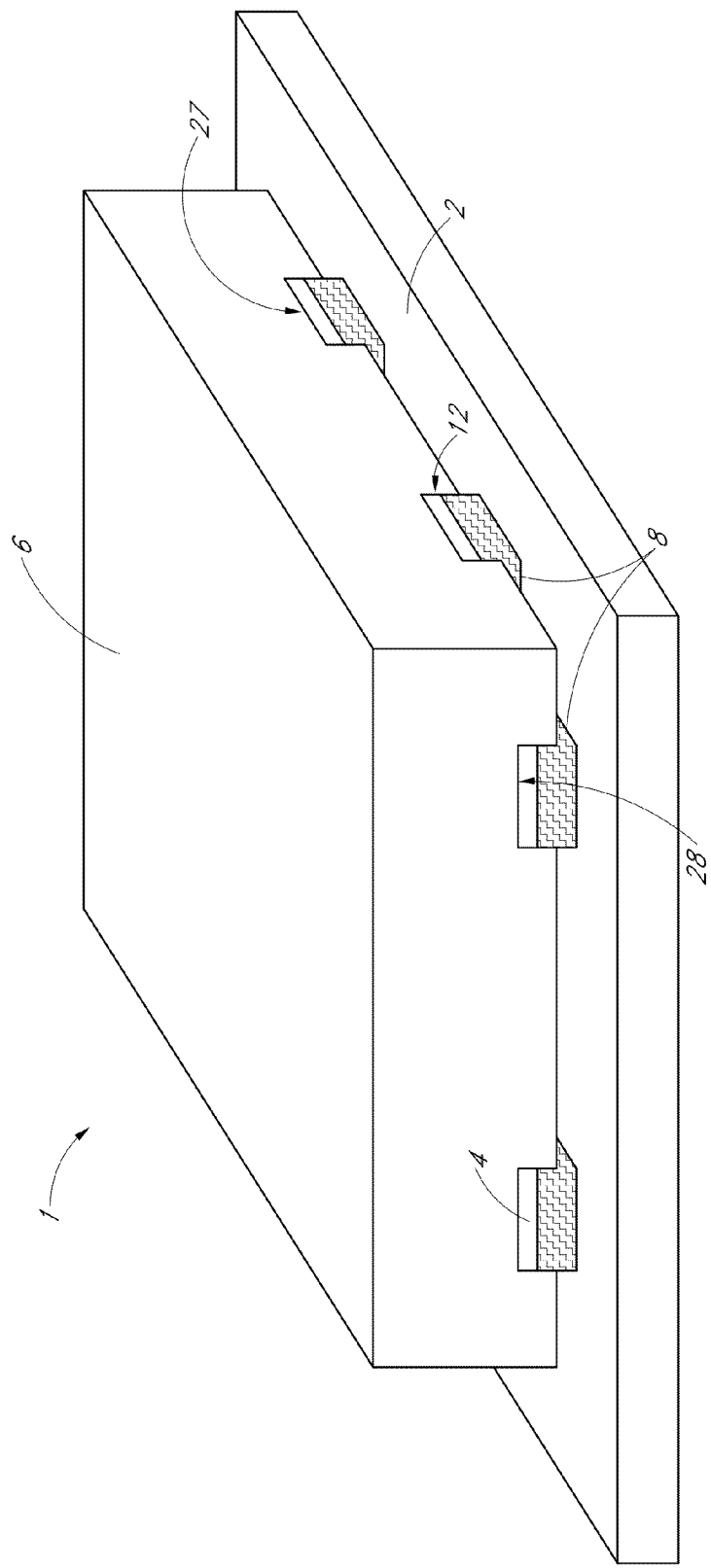
FIG. 7B is a 3D perspective view of the package of FIG. 7A mounted on a system substrate.

FIG. 7A is a perspective view of an integrated device package 1 after singulation (e.g., after physically and electrically separating the leadframe cells from one another in an array), according to one embodiment. The outer ends 12 and the bottom surface of the leads 4 can be exposed through the package body 6 (e.g., a molding material as shown). As illustrated, sufficient portions of the outer ends 12 of the leads are plated such that a solder joint extending up the outer end 12 is visible to an optical inspection system. In FIG. 7A, only the etched lower portions 26 of the outer ends 12 of the leads 4 are plated with the plating layer 7 (or 7a in some implementations). The plating layer 7 (or 7a) can also cover the etched bottom surface of the upper portion 27 of the outer end 12, but the overhang length δ of the upper portion 27 as described above is not visible in FIG. 7A (see, e.g., FIG. 2K). The upper portions 27 of the outer ends 12 can also include the sawed surface 28 created during saw singulation of the package 1. When the package 1 of FIG. 7A is soldered to a system substrate, the solder can reflow up the etched and plated lower portion 26 of the outer end. Because the plating layer 7 (or 7a) is applied over an etched surface (e.g., etched sidewall 21 or the etched bottom surface 22 of the upper portion 27), no saw burrs interfere with the solder bond by, e.g., increasing standoff and/or breaking off. FIG. 7B illustrates the package 1 of FIG. 7A soldered to a system substrate 2. As shown, the solder joint 8 extends smoothly up the outer ends 12 of the leads 4. In some embodiments, the system substrate 2 can be a motherboard (e.g., printed circuit board) configured to be mounted on or within a larger external device, such as an electronic device or any other suitable larger system.

Figure 7C:
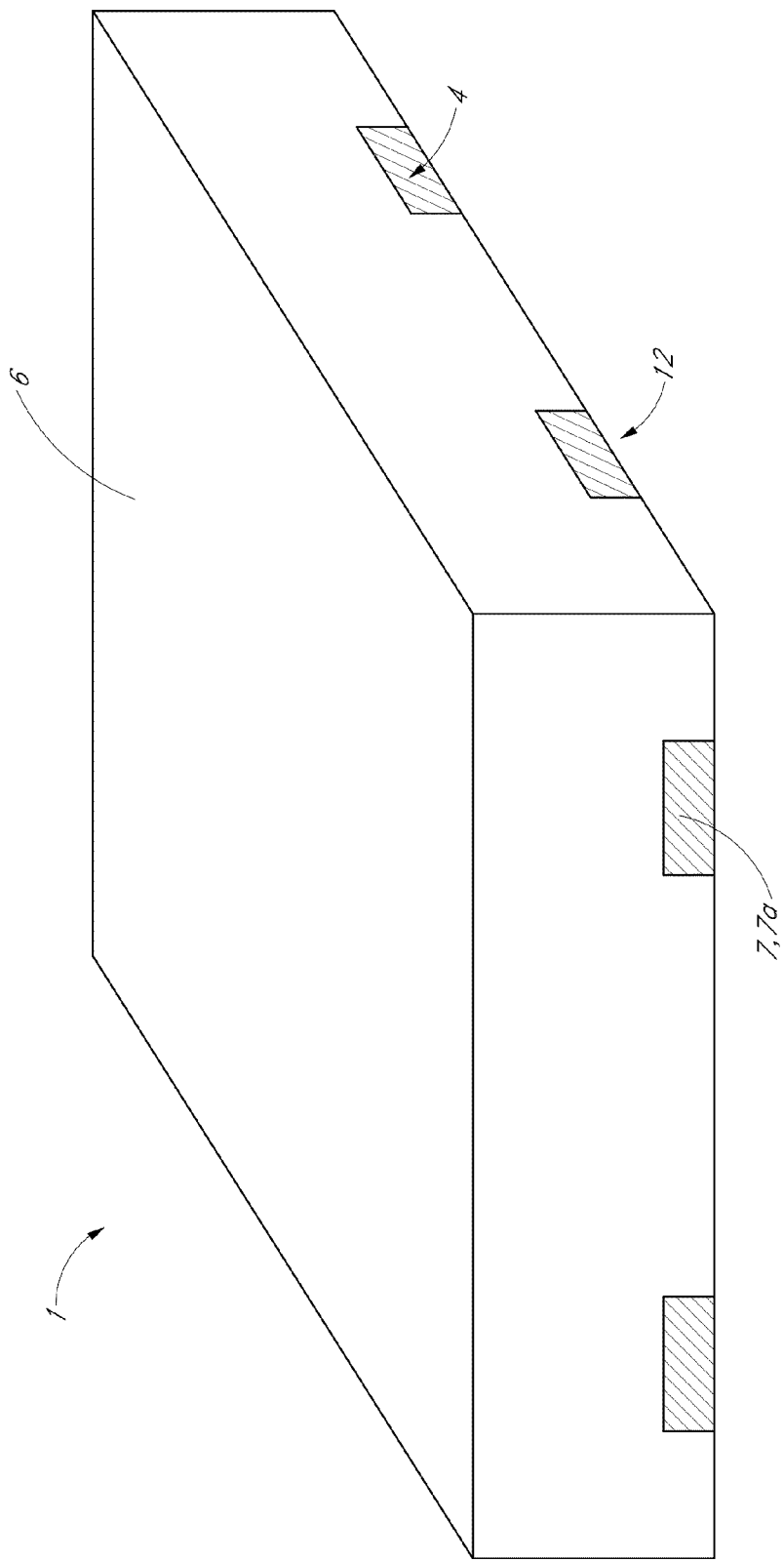
FIG. 7C is a 3D perspective view of an integrated device package according to another embodiment.
Figure 7D:
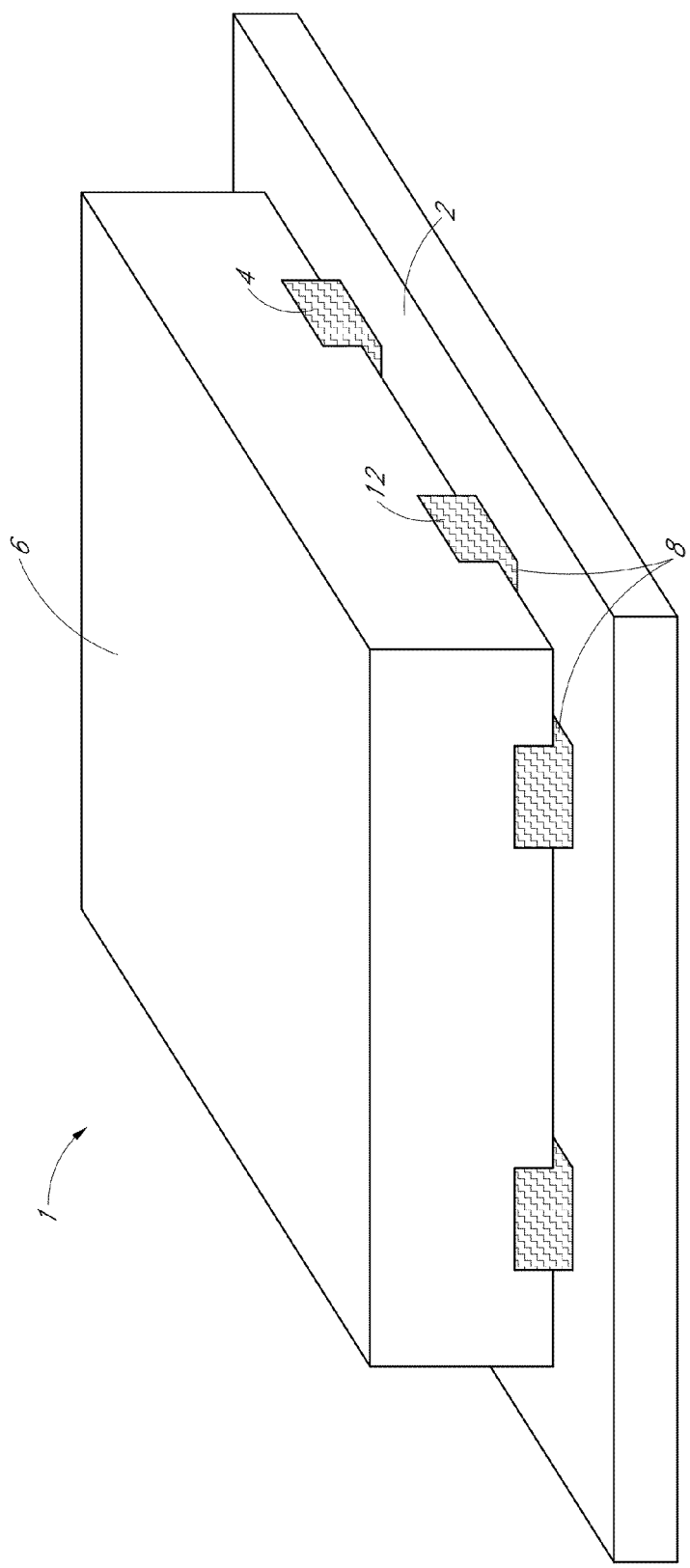
FIG. 7D is a 3D perspective view of the package of FIG. 7C mounted on a system substrate.

Another embodiment of a singulated integrated device package 1 is shown in FIG. 7C. The embodiment of FIG. 7C is similar to that of FIG. 7A, except the full thickness (or height) of the leads 4 is etched and plated by the plating layer 7 (or 7a). Unlike FIG. 7A, there is no sawed portion of the leads in FIG. 7C. As with FIG. 7A, plating the entire outer ends 12 (including the entire height of the leads) as shown in FIG. 7C can improve the reliability of solder bonds on the outer ends 12 of the leads 4. Indeed, FIG. 7D illustrates the package 1 of FIG. 7C mounted to a system substrate 2. As with FIG. 7B, the solder joint 8 of FIG. 7D extends smoothly up the outer ends 12 of the leads 4. As in the embodiment of FIG. 7B, the system substrate can be a circuit board that is part of any suitable larger system, such as an electronic device.

Applications

Devices employing the above described schemes can be implemented into various electronic devices. Examples of the electronic devices can include, but are not limited to, consumer electronic products, parts of the consumer electronic products, electronic test equipment, automobiles, etc. Examples of electronic products can include, but are not limited to, a mobile phone, a telephone, a computer, a handheld computer, a personal digital assistant (PDA), an automobile, a multi functional peripheral device, medical devices (such as hearing aids), etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow

What is claimed is:

1. A packaged integrated device comprising:
   a die attach pad having a top surface and a bottom surface;
   a plurality of leads physically and electrically separated from the die attach pad and positioned at least partially around the perimeter of the die attach pad, each lead having a top surface, a bottom surface, an outer end facing away from the die attach pad, and a substantially smooth etched lower portion that spans substantially the entire width of the outer end of each lead, the etched lower portion free of burrs;
   an integrated device die mounted on the top surface of the die attach pad;
   a package body covering the integrated device die and at least part of the plurality of leads, wherein at least a portion of the bottom surface of each of the plurality of leads is exposed through the package body; and
   a plating layer covering the etched lower portion that spans substantially the entire width of the outer end of each lead with a substantially smooth profile and covering at least the exposed portion of the bottom surface of each lead.

2. The packaged integrated device of claim 1, wherein substantially the entire outer end is etched and the plating layer covers substantially the entire height of the outer end of each lead.

3. The packaged integrated device of claim 2, wherein an outer perimeter of the package body overhangs the outer end of each lead.

4. The packaged integrated device of claim 3, further comprising a portion of a jump bond embedded within the package, wherein the portion of the jump bond comprises a bonding wire extending from one of the leads to the outer perimeter of the package body.

5. The packaged integrated device of claim 3, further comprising a topside plating layer applied over at least the top surface of each lead, wherein the outer perimeter of the package body is substantially flush with an outer perimeter of the topside plating layer, and wherein the outer perimeter of the topside plating layer overhangs the outer end of each lead.

6. The packaged integrated device of claim 1, wherein the plating layer extends from the bottom surface of the leads and extends over less than about 50% of the height of the outer end of each lead.

7. The packaged integrated device of claim 1, wherein the etched lower portion of the outer end of each lead is angled outwardly from the bottom surface of each lead, the outer end of each lead disposed substantially at a periphery of the packaged integrated device.

8. The packaged integrated device of claim 1, wherein the outer end of each lead further comprises an upper portion extending over the etched lower portion, the upper portion having an etched bottom surface formed at an angle with the etched lower portion, and wherein the plating layer extends from the bottom surface of each lead to cover the etched lower portion and the bottom surface of the upper portion.

9. The packaged integrated device of claim 8, wherein the upper portion of the outer end of each lead includes a sawed end surface angled upwardly from the etched bottom surface of the upper portion, and wherein the etched lower portion of the outer end of each lead is angled outwardly from the bottom surface of the lead.

10. The packaged integrated device of claim 1, wherein the plating layer is at least one selected from the group consisting of: a nickel-palladium-gold (NiPdAu) plating layer, a nickel-palladium-gold-silver (NiPdAuAg) plating layer, a nickel-palladium (NiPd) plating layer, a tin (Sn) plating layer, a tin-lead (SnPb) plating layer, a gold (Au) plating layer, and a silver (Ag) plating layer.

11. The packaged integrated device of claim 1, wherein the integrated device die is wire bonded to one or more of the leads, and wherein the package body comprises a molding material formed over a portion of the leads, the bonding wires, and the integrated device die.

12. The packaged integrated device of claim 11, wherein the molding material is formed over at least a portion of an inner end of each lead facing the die attach pad, a portion of a first side surface of each lead, and a portion of a second side surface of each lead.

13. An electronic device comprising:
the packaged integrated device of claim 1; and
a substrate electrically coupled to the packaged integrated device, wherein one or more electrical contacts on the substrate are soldered to the exposed bottom surface of each lead.

14. The electronic device of claim 13, wherein the solder extends from the bottom surface of each lead to bond to at least a portion of the plated layer covering the outer end of each lead.

15. The packaged integrated device of claim 1, wherein the package body does not cover the etched lower portion.

16. The packaged integrated device of claim 1, wherein the package body comprises a molding material.

17. The packaged integrated device of claim 1, wherein the integrated device die comprises an integrated circuit die.

18. The packaged integrated device of claim 1, wherein the integrated device die comprises a microelectromechanical systems (MEMS) die.

19. The packaged integrated device of claim 1, wherein the etched lower portion is not sawn.

20. The packaged integrated device of claim 1, wherein the etched lower portion is not punched.

21. The packaged integrated device of claim 1, wherein the etched lower portion of the outer end of a particular lead is smoother than a sawn surface of the particular lead.

22. The packaged integrated device of claim 1, wherein the etched lower portion of the outer end of a particular lead is smoother than a punched surface of the particular lead.

23. The packaged integrated device of claim 1, wherein the plating layer is disposed directly over the etched lower portion.

* * * * *